US012740406B2

(12) United States Patent
Yen et al.

(10) Patent No.: US 12,740,406 B2
(45) Date of Patent: Sep. 15, 2026

(54) INTEGRATED DEVICE COMPRISING STACKED INDUCTORS WITH LOW OR NO MUTUAL INDUCTANCE

(71) Applicant: QUALCOMM Incorporated, San Diego, CA (US)

(72) Inventors: Hsiao-Tsung Yen, San Diego, CA (US); Xingyi Hua, San Diego, CA (US); Jeongil Jay Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 604 days.

(21) Appl. No.: 18/189,673

(22) Filed: Mar. 24, 2023

(65) Prior Publication Data

US 2024/0321730 A1 Sep. 26, 2024

(51) Int. Cl.

*H10W 20/40* (2026.01)
*H10D 1/20* (2025.01)
*H10W 70/05* (2026.01)
*H10W 70/09* (2026.01)
*H10W 70/60* (2026.01)
(Continued)

(52) U.S. Cl.

CPC ............ *H10W 20/497* (2026.01); *H10D 1/20* (2025.01); *H10W 70/05* (2026.01); *H10W 70/09* (2026.01); *H10W 70/60* (2026.01); *H10W 70/652* (2026.01); *H10W 72/01257* (2026.01); *H10W 72/01935* (2026.01); *H10W 72/242* (2026.01);
(Continued)

(58) Field of Classification Search

CPC ..... H01L 23/5227; H01L 24/02; H01L 24/03; H10D 1/20; H10W 20/497; H10W 70/05; H10W 70/09

See application file for complete search history.

(56) References Cited

U.S. PATENT DOCUMENTS

| | | | | |
|---|---|---|---|---|
| 6,841,847 B2 * | 1/2005 | Sia | H10D 84/00 257/E21.022 |
| 8,289,118 B2 * | 10/2012 | Chiu | H01F 17/0013 336/200 |

(Continued)

FOREIGN PATENT DOCUMENTS

| | | | | |
|---|---|---|---|---|
| CN | 102576657 A * | 7/2012 | H01F 17/0013 |
| CN | 113614915 B * | 5/2025 | H10W 20/497 |

(Continued)

OTHER PUBLICATIONS

International Search Report and Written Opinion—PCT/US2024/018914—ISA/EPO—Jun. 14, 2024.

*Primary Examiner* — Laura M Menz
(74) *Attorney, Agent, or Firm* — Loza & Loza, LLP

(57) ABSTRACT

An integrated device comprising a die substrate, a die interconnection portion coupled to the die substrate, and a stacked inductor that includes a first figure 8-shaped inductor and a second figure 8-shaped inductor. The stacked inductor may include a first spiral comprising a first origin and a first tail, a second spiral comprising a second origin and a second tail, a third spiral comprising a third origin and a third tail and a fourth spiral comprising a fourth origin and a fourth tail. The first spiral, the second spiral, the third spiral and the fourth spiral may form the first figure 8-shaped inductor and the second figure 8-shaped inductor. The stacked inductor may be located in the die interconnection.

24 Claims, 24 Drawing Sheets

(51) Int. Cl.
*H10W 70/652* (2026.01)
*H10W 72/00* (2026.01)
*H10W 72/20* (2026.01)
*H10W 72/29* (2026.01)
*H10W 72/90* (2026.01)
*H10W 90/00* (2026.01)

(52) U.S. Cl.
CPC ........ *H10W 72/29* (2026.01); *H10W 72/9415* (2026.01); *H10W 90/724* (2026.01)

(56) References Cited

U.S. PATENT DOCUMENTS

| | | | | |
|---|---|---|---|---|
| 9,111,675 | B1 * | 8/2015 | Kireev | H01F 17/0013 |
| 9,312,060 | B2 * | 4/2016 | Godoy | H01F 27/006 |
| 9,697,938 | B2 * | 7/2017 | Yan | H01F 5/003 |
| 9,773,606 | B2 * | 9/2017 | Yen | H01F 27/2804 |
| 9,847,291 | B2 * | 12/2017 | Leong | H10W 20/497 |
| 10,170,232 | B2 * | 1/2019 | Li | H01F 27/29 |
| 11,011,461 | B2 * | 5/2021 | Zhang | H10W 20/497 |
| 11,244,783 | B2 * | 2/2022 | Yen | H01F 27/2804 |
| 11,651,884 | B2 * | 5/2023 | Vanukuru | H01F 17/0013 336/200 |
| 2004/0041234 | A1 * | 3/2004 | Sia | H10D 1/20 257/E21.022 |
| 2004/0108933 | A1 * | 6/2004 | Chen | H01F 17/0013 336/200 |
| 2005/0104158 | A1 * | 5/2005 | Bhattacharjee | H10D 1/20 257/E21.022 |
| 2009/0244866 | A1 * | 10/2009 | Kawano | H01F 38/14 336/200 |
| 2012/0075050 | A1 * | 3/2012 | Kawano | H01F 38/14 336/200 |
| 2014/0077919 | A1 * | 3/2014 | Godoy | H01F 30/08 336/226 |
| 2015/0170824 | A1 * | 6/2015 | Tesson | H01F 27/2804 336/190 |
| 2015/0206634 | A1 * | 7/2015 | Yan | H01F 5/003 336/182 |
| 2015/0289360 | A1 * | 10/2015 | Leong | H10W 20/497 361/782 |
| 2017/0125152 | A1 * | 5/2017 | Li | H01F 17/0013 |
| 2018/0144857 | A1 * | 5/2018 | Vanukuru | H01F 17/0013 |
| 2019/0252316 | A1 * | 8/2019 | Zhang | H10W 20/497 |
| 2022/0068539 | A1 * | 3/2022 | Yen | H01F 27/29 |
| 2022/0285080 | A1 * | 9/2022 | Kim | H01F 17/0013 |
| 2023/0223362 | A1 * | 7/2023 | Suraj Prakash | H01F 27/2804 257/531 |
| 2024/0021353 | A1 * | 1/2024 | Kim | H01F 17/0013 |
| 2024/0321497 | A1 * | 9/2024 | Yen | H01F 17/0013 |
| 2024/0321730 | A1 * | 9/2024 | Yen | H01F 17/0013 |
| 2025/0105145 | A1 * | 3/2025 | Liu | H10W 20/497 |

FOREIGN PATENT DOCUMENTS

| | | | | | |
|---|---|---|---|---|---|
| CN | 120981869 | A | * | 11/2025 | H10W 70/09 |
| DE | 102020202185 | A1 | * | 10/2020 | H10W 42/60 |
| EP | 2887364 | B1 | * | 6/2017 | H01F 27/2804 |
| EP | 3069356 | B1 | * | 10/2019 | H01F 17/0013 |
| EP | 2973773 | B1 | * | 8/2022 | H10W 20/497 |
| TW | I651826 | B | * | 2/2019 | H10W 90/00 |
| WO | WO-2015109183 | A1 | * | 7/2015 | H10W 20/497 |
| WO | WO-2015153009 | A1 | * | 10/2015 | H10W 90/00 |
| WO | WO-2017079337 | A1 | * | 5/2017 | H01F 17/02 |
| WO | WO-2024015697 | A1 | * | 1/2024 | H10W 20/497 |
| WO | WO-2024158526 | A1 | * | 8/2024 | H10W 90/401 |
| WO | WO-2024205857 | A1 | * | 10/2024 | H10W 70/685 |
| WO | WO-2024205858 | A1 | * | 10/2024 | H10W 70/09 |

* cited by examiner

CROSS SECTIONAL PROFILE VIEW

SIDE PROFILE VIEW

CROSS SECTIONAL PROFILE VIEW

PORT A
PORT B
1336
1386
1310
THIRD METAL LAYER
SECOND METAL LAYER
FIRST METAL LAYER
1307
1370
1374
1376
1372
1386
1382
1308
1384
1380
1303
1330
1334
1336
1332
1326
1322
1302
1320
1324
1305
1350
1354
1356
1352
1366
1362
1306
1360
1364

INTEGRATED DEVICE COMPRISING STACKED INDUCTORS WITH LOW OR NO MUTUAL INDUCTANCE

FIELD

Various features relate to integrated devices with inductors.

BACKGROUND

A package may include a substrate and integrated devices. These components are coupled together to provide a package that may perform various functions. The performance of a package and its components may depend on how these components are configured together. Several inductors may be configured to be electrically coupled to an integrated device. These inductors can take up a lot of real estate in the package, which can limit how small an integrated device and/or a package can be. There is an ongoing need to provide integrated devices and/or packages with smaller form factors, while improving the performance of the integrated devices and/or the packages.

SUMMARY

Various features relate to integrated devices with inductors.

One example provides an integrated device comprising a die substrate, a die interconnection portion coupled to the die substrate, and a stacked inductor that includes a first figure 8-shaped inductor and a second figure 8-shaped inductor.

Another example provides a method for fabricating an integrated device. The method provides a die substrate. The method forms a die interconnection portion that is coupled to the die substrate. Forming the die interconnection portion includes forming a plurality of die interconnects. Some die interconnects from the plurality of die interconnects form a stacked inductor that includes a first figure 8-shaped inductor and a second figure 8-shaped inductor.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Figure 8:
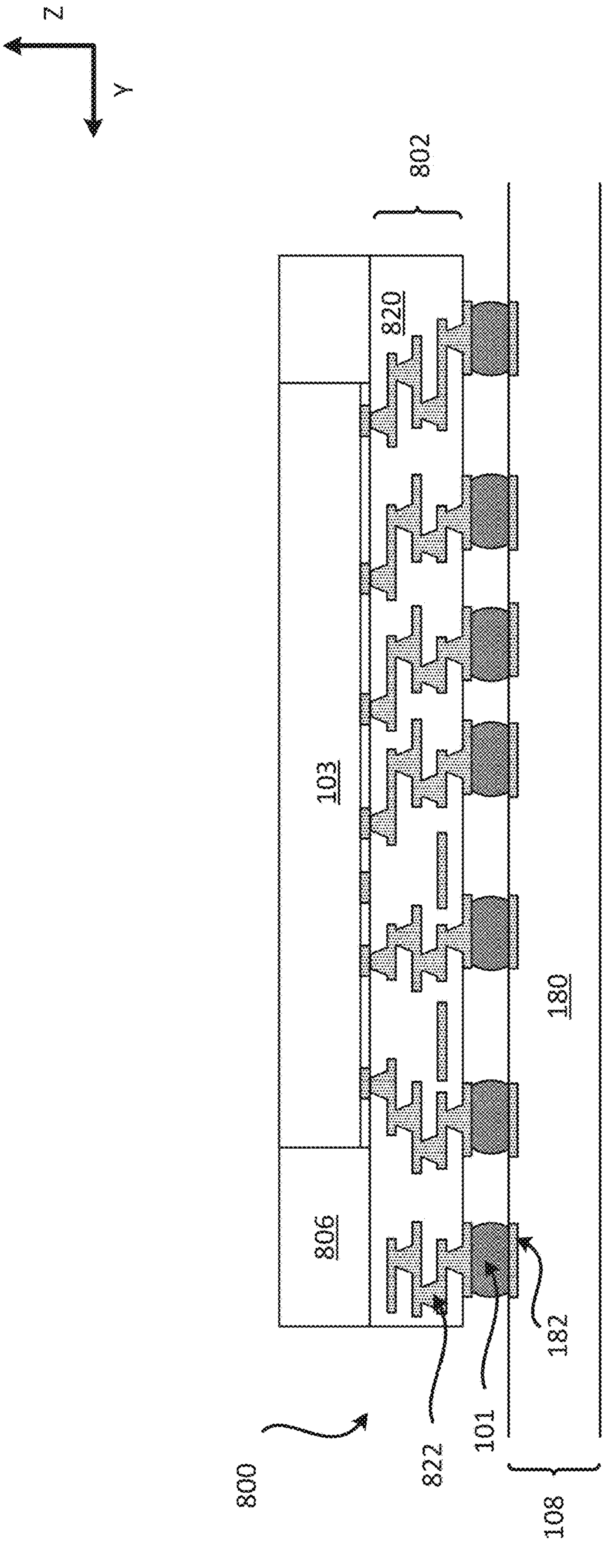
FIG. 8 illustrates a profile cross sectional view of an exemplary package that includes an integrated device and a metallization portion, where the package can include two inductors, and where one of the inductors includes a stacked inductor comprising a figure 8-shaped inductor.

The present disclosure describes an integrated device that includes a die substrate, a die interconnection portion coupled to the die substrate, and a stacked inductor that includes a first figure 8-shaped inductor and a second figure 8-shaped inductor. The stacked inductor may include a first spiral comprising a first origin and a first tail, a second spiral comprising a second origin and a second tail, a third spiral comprising a third origin and a third tail and a fourth spiral comprising a fourth origin and a fourth tail. The first spiral, the second spiral, the third spiral and the fourth spiral may form the first figure 8-shaped inductor and the second figure 8-shaped inductor. The stacked inductor may be located in the die interconnection. In some implementations, the first spiral and the second spiral form the first figure 8-shaped inductor on a metal layer (e.g., first metal layer), and the third spiral and the fourth spiral form the second figure 8-shaped inductor on another metal layer (e.g., second metal layer). In some implementations, the first spiral and the fourth spiral form the first figure 8-shaped inductor on a first metal layer and a third metal layer, the second spiral and the third spiral form the second figure 8-shaped inductor on the first metal layer and the third metal layer, and the first figure 8-shaped inductor is interleaved with the second figure 8-shaped inductor. The integrated device may include another inductor and/or another stacked inductor. In some implementations, the inductors may be implemented in a die interconnection portion and/or a metallization portion (e.g., redistribution portion) of an integrated device. In some implementations, the inductors may be implemented in an integrated device and a package substrate of a package. The figure 8-shaped inductor design may have 2 coils (e.g., spirals), where each coil has a different current orientation. Any coupled signal that has been induced on these 2 coils, will be cancelled due to the 2 induced currents that are formed in different orientation. Thus, the use of forming and placing one figure 8-shaped inductor with surrounded by one spiral inductor provides an inductor with little or no mutual inductance due to the fundamentals of the figure 8-shaped inductor, while still providing a high Q factor inductor, based on the shunt structure of the first metal layer and the third metal layer, which is further described below. Moreover, the use of series stacked 8-shaped inductors helps provide an inductor with a high inductance, while having a small form factor, which is formed based on a structure that combines 2 different inductor structures. As will be further described below, an inductor may include a second spiral and a third spiral that may form a figure 8-shaped inductor, where a first spiral and a fourth spiral of the inductor are the extension series stacking metals to wind out the metal trace to the outer turns of the inductor. Moreover, the fifth spiral and the sixth spiral of the inductor may be the shunt structure of the second and the third spirals which provide lower resistance to improve the quality factor value of the inductor. Thus, the series stacked inductors may provide an inductance that is similar to an inductance of an inductor that is larger in size than the first inductor.

Exemplary Package Comprising Inductors

Figure 1:
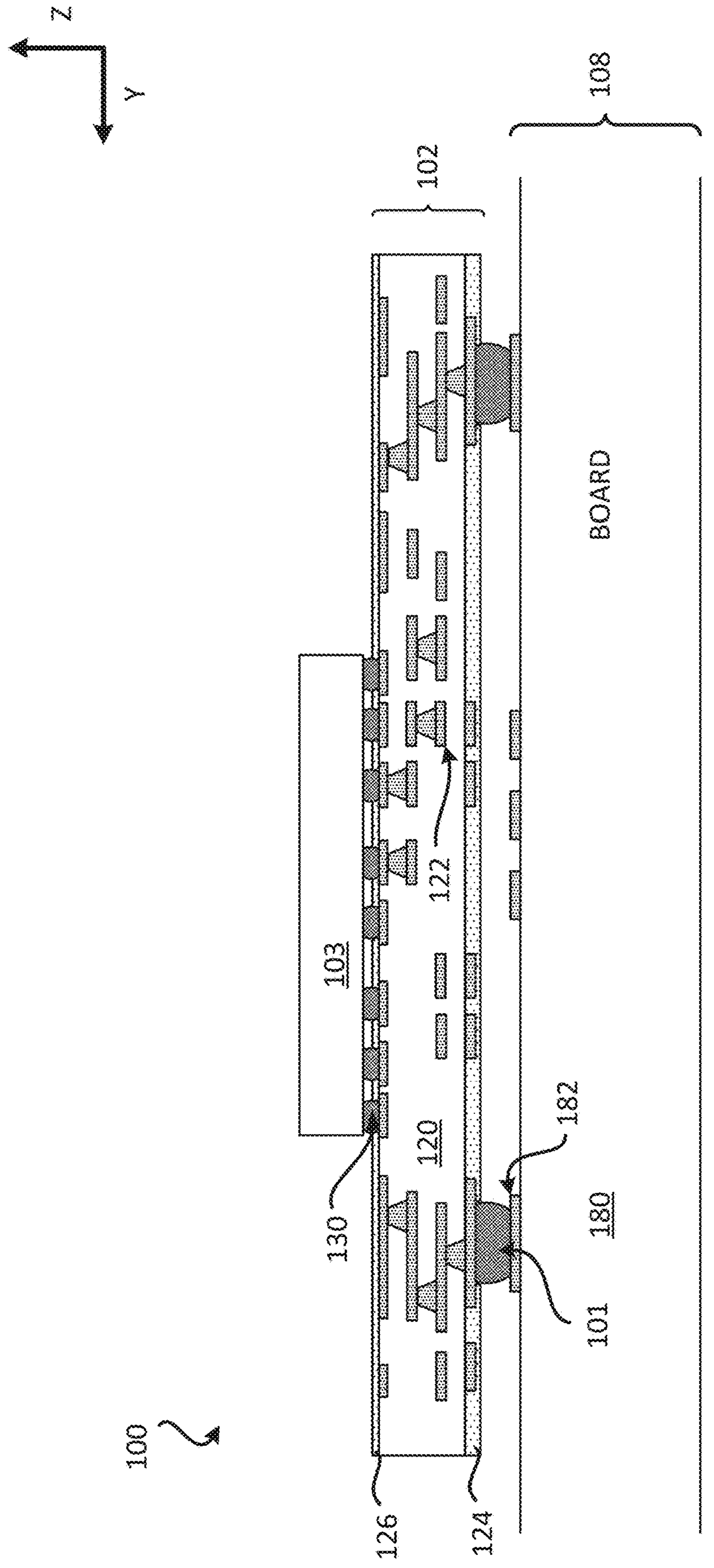
FIG. 1 illustrates a profile cross sectional view of an exemplary package that includes an integrated device and a package substrate

FIG. 1 illustrates a profile cross sectional view of a package 100 that includes a substrate 102 and an integrated device 103. The package 100 is coupled to a board 108 (e.g., printed circuit board) through a plurality of solder interconnects 101. The board 108 includes at least one board dielectric layer 180 and a plurality of board interconnects 182. The package 100 is coupled to the plurality of board interconnects 182 of the board 108 (e.g., printed circuit board) through the plurality of solder interconnects 101. The plurality of solder interconnects 101 may be coupled to board interconnects from the plurality of board interconnects 182.

The substrate 102 may be a package substrate. The substrate 102 includes a first surface (e.g., top surface) and a second surface (e.g., bottom surface). The substrate 102 includes at least one dielectric layer 120 (e.g., at least one substrate dielectric layer) and a plurality of interconnects 122 (e.g., plurality of substrate interconnects). The at least one dielectric layer 120 may include prepreg. In some implementations, the first surface of the substrate 102 includes a solder resist layer 126 and the second surface of the substrate 102 includes a solder resist layer 124. The substrate 102 may be a laminate substrate. Different implementations may use different types of substrates. Different implementations may use different materials for the at least one dielectric layer 120. The plurality of solder interconnects 101 may be coupled to interconnects from the plurality of interconnects 122.

The integrated device 103 is coupled to the first surface (e.g., top surface) of the substrate 102 through a plurality of solder interconnects 130. For example, the integrated device 103 may be coupled to the substrate 102 through a plurality of pillar interconnects (not shown) and the plurality of solder interconnects 130. The plurality of solder interconnects 130 may be coupled to one or more interconnects from the plurality of interconnects 122. The integrated device 103 includes a front side and a back side. The front side of the integrated device 103 faces the substrate 102. Different implementations may use different types of integrated devices. An example of an integrated device is illustrated and described below in at least FIG. 7.

As will be further described below, a first inductor and a second inductor may be implemented in the package 100. The first inductor and the second inductor may be a pair of inductors that have a mutual inductance of zero (0) or near zero. The first inductor and the second inductor may have a mutual inductance (e.g., coefficient of coupling K) in a range of about 0-0.1. The first inductor and the second inductor may be stacked inductors. The first inductor may include a first spiral and a second spiral. The second inductor may include a spiral inductor. The first inductor and/or the second inductor may be implemented as interconnects (i) on the metal layer(s) of the integrated device 103, (ii) on the metal layer(s) of the substrate 102, (iii) between metal layers of the integrated device 103, and/or (iv) between metal layers of the substrate 102. In some implementations, some solder interconnects of the solder interconnects 130 may be considered part of the first inductor and/or the second inductor. In some implementations, some solder interconnects of the solder interconnects 101 may be considered part of the first inductor and/or the second inductor. In some implementations, the first inductor may be located above or below the second inductor. In some implementations, a first portion of the first inductor may be located above the second inductor, and a second portion of the first inductor may be located below the second inductor. In some implementations, the first inductor may be located above and below the second inductor. In some implementations, the first inductor and/or the second inductor may be a FIG. 8 shaped inductor. In some implementations, the first inductor may be coupled to the second inductor in shunt and/or series. In some implementations, the first inductor and the second inductor may be configured to operate as a transformer. The first inductor and the second inductor may provide high inductance values while occupying a much smaller footprint and/or real estate in the package. This allows the package and/or the integrated device to have a smaller lateral area through the inductor designs sharing of the lateral space and/or vertical stacking of inductors, without sacrificing and/or diminishing the performance of the package and/or the integrated device. In some implementations, at one or more turns of the first inductor vertically overlaps with the second inductor.

FIGS. 2-6 and 9-14 illustrate examples of different configurations of inductors and/or different inductor combinations that may be implemented in a package, an integrated device and/or a substrate.

Figure 2:
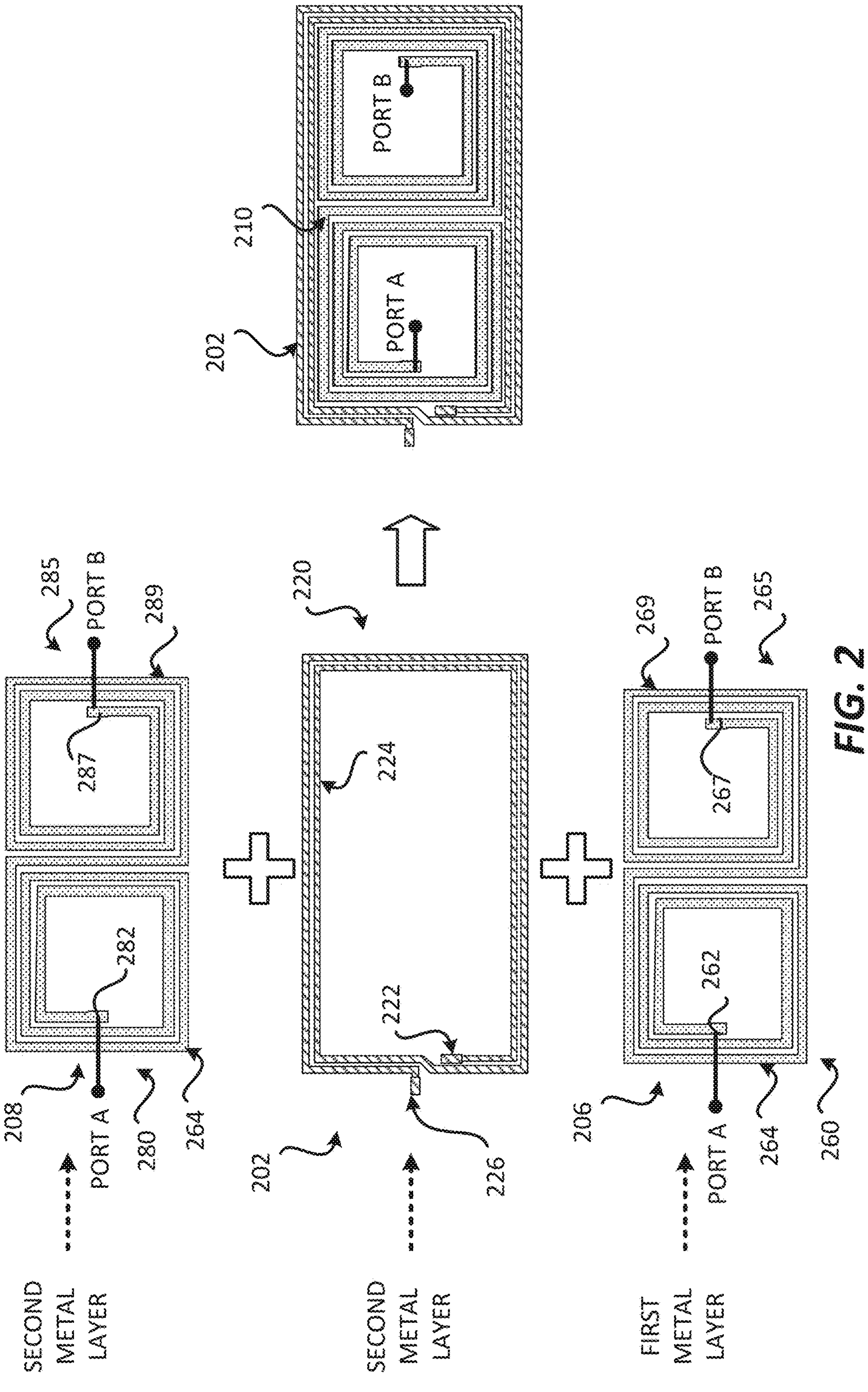
FIG. 2 illustrates an exemplary view of two inductors, where one of the inductors includes a stacked inductor comprising a figure 8-shaped inductor.

FIG. 2 illustrates an inductor 202, an inductor 206 and an inductor 208. Some of the inductors are located on different metal layers. For example, the inductor 206 may be located on a first metal layer, the inductor 202 and the inductor 208 may be located on a second metal layer. FIG. 2 illustrates an example of two figure 8-shaped inductors and/or spirals that are vertically stacked (e.g., stacked figure 8-shaped inductor).

In some implementations, the inductor 206 and the inductor 208 may be coupled together in shunt. In some implementations, the inductor 202, the inductor 206 and the inductor 208 may be configured to operate as a transformer with two inductors.

The inductor 202 includes a spiral 220, an origin 222, a tail 224 and a tail terminal 226. The spiral 220 may include the origin 222, the tail 224 and the tail terminal 226. In some implementations, the spiral 220 may have a second rotational direction (e.g., counter clockwise rotation). A rotational direction of a spiral may be defined by the origin of the spiral as being the starting point of the spiral. In some implementations, the spiral 220 has a different rotational direction (e.g., clockwise rotation). The inductor 202 laterally surrounds the inductor 208, on the second metal layer.

The inductor 206 includes a spiral 260, an origin 262, a tail 264, a spiral 265, an origin 267, and a tail 269. The spiral 260 includes the origin 262 and the tail 264. The spiral 265 includes the origin 267 and the tail 269. The spiral 260 is coupled to the spiral 265. The tail 264 of the spiral 260 is coupled to the tail 269 of the spiral 265. In some implementations, the spiral 260 may have a first rotational direction (e.g., clockwise rotation). In some implementations, the spiral 265 may have a first rotational direction (e.g., clockwise rotation). In some implementations, the spiral 260 and/or the spiral 265 have a different rotational direction (e.g., counter clockwise rotation).

The inductor 208 includes a spiral 280, an origin 282, a tail 284, a spiral 285, an origin 287, and a tail 289. The spiral 280 includes the origin 282 and the tail 284. The spiral 285 includes the origin 287 and the tail 289. The spiral 280 is coupled to the spiral 285. The tail 284 of the spiral 280 is coupled to the tail 289 of the spiral 285. In some implementations, the spiral 280 may have a first rotational direction (e.g., clockwise rotation). In some implementations, the spiral 285 may have a first rotational direction (e.g., counter clockwise rotation). In some implementations, the spiral 280 and/or the spiral 285 have a different rotational direction (e.g., counter clockwise rotation).

In some implementations, the inductor 206 and the inductor 208 are shunt. For example, a current may travel through the inductor 206 and another similar current may travel through the inductor 208, at the same time. In some implementations, the origin 262 of the inductor 206 and the origin 282 of the inductor 208 may be part of a first port (e.g., port A). The origin 262 may be coupled to the origin 282 through one or more interconnects (e.g., vias, pads, traces). In some implementations, the origin 267 of the inductor 206 and the origin 287 of the inductor 208 may be a second port (e.g., port B). The origin 267 may be coupled to the origin 287 through one or more interconnects (e.g., vias, pads, traces). The sharing of the port A and port B by the inductor 206 and the inductor 208 means that two currents (e.g., same currents, similar currents) may travel in parallel through the inductor 206 and the inductor 208 at the same time. For example, one current may enter through the port A and split through the inductor 206 and the inductor 208, where the current exits through port B of the inductor 206 and the inductor 208.

In some implementations, a current (e.g., electrical current) may travel through the inductor 206 through an electrical path that includes the origin 262, the tail 264, the tail 269 and the origin 267. In some implementations, a current may enter through the origin 262 and exit through the origin 267. In some implementations, a current may enter through the origin 267 and exit through the origin 262. Thus, a current may travel through the spiral 260 and the spiral 265.

In some implementations, a current (e.g., electrical current) may travel through the inductor 208 through an electrical path that includes the origin 282, the tail 284, the tail 289 and the origin 287. In some implementations, a current may enter through the origin 282 and exit through the origin 287. In some implementations, a current may enter through the origin 287 and exit through the origin 282. Thus, a current may travel through the spiral 280 and the spiral 285.

In some implementations, a current (e.g., electrical current) may travel through the inductor 202 through an electrical path that includes the origin 222, the tail 224, the tail terminal 226. In some implementations, a current may enter through the origin 222 and exit through the tail terminal 226. In some implementations, a current may enter through the tail terminal 226 and exit through the origin 222.

The inductor 206 and the inductor 208 may form a stacked inductor 210 that includes several spirals, windings and/or turns. The stacked inductor 210 formed from the inductor 206 and the inductor 208 may be located on two or more metal layers. The stacked inductor 210 may include two figure 8-shaped spirals. The stacked inductor 210 may include a first figure 8-shaped spiral on a first metal layer and a second figure 8-shaped spiral on a second metal layer.

The inductor 206 may vertically overlap with the inductor 208. In some implementations, the inductor 206 is located above the inductor 208. In some implementations, the inductor 206 is located below the inductor 208. In some implementations, the inductor 206 may have the same design as the inductor 208. In some implementations, the inductor 206 may have a different design from the inductor 208, such as a different spiral, a different number of turns, a different shape, and/or a different size. It is noted that the first metal layer and the second metal layer may be adjacent to each other. However, in some implementations, there may be one or more metal layers between the first metal layer and the second metal layer. For example, in some implementations, the first metal layer may be an M1 metal layer and the second metal layer may be a M2 metal layer. In another example, in some implementations, the first metal layer may be an M3 metal layer and the second metal layer may be a M1 metal layer.

The stacked inductor 210 and the inductor 202 may be configured to operate as a transformer. In some implementations, a current that flows and/or travels through the stacked inductor 210 may induce a current through the inductor 202. Similarly, in some implementations, a current that flows and/or travels through the inductor 202 may induce a current through the stacked inductor 210. The inductor 202 and the stacked inductor 210 may have a mutual inductance (e.g., coefficient of coupling K) in a range of about 0-0.1. In some implementations, the inductor 202 may be located on the same metal layer as the inductor 206. In such instances, the inductor 202 may laterally surround the inductor 206.

The design of the stacked inductor 210 may provide high inductance values while occupying a much smaller footprint and/or real estate in the package. This allows the package and/or the integrated device to have a smaller lateral area through the inductor designs sharing of the lateral space and/or the vertical stacking inductors with one another, without sacrificing and/or diminishing the performance of the package and/or the integrated device. Thus, the stacked inductor 210 that is located on several metal layers may provide an inductance that is similar to an inductance of a comparable inductor that is larger in lateral size than the stacked inductor 210.

It is noted that any of the inductors described in the disclosure may have different designs, including different spirals, different numbers of turns, different windings, and/or different crossings. The number of turns in the spiral in the inductors shown in the disclosure are exemplary. Different implementations may have inductors with spirals that have different numbers of turns. The designs of the inductors are not limited to what is shown in the figures of the disclosure. Different implementations may have different designs to form symmetrical inductors to achieve a mutual inductance of zero (0) or near zero.

Figure 3:
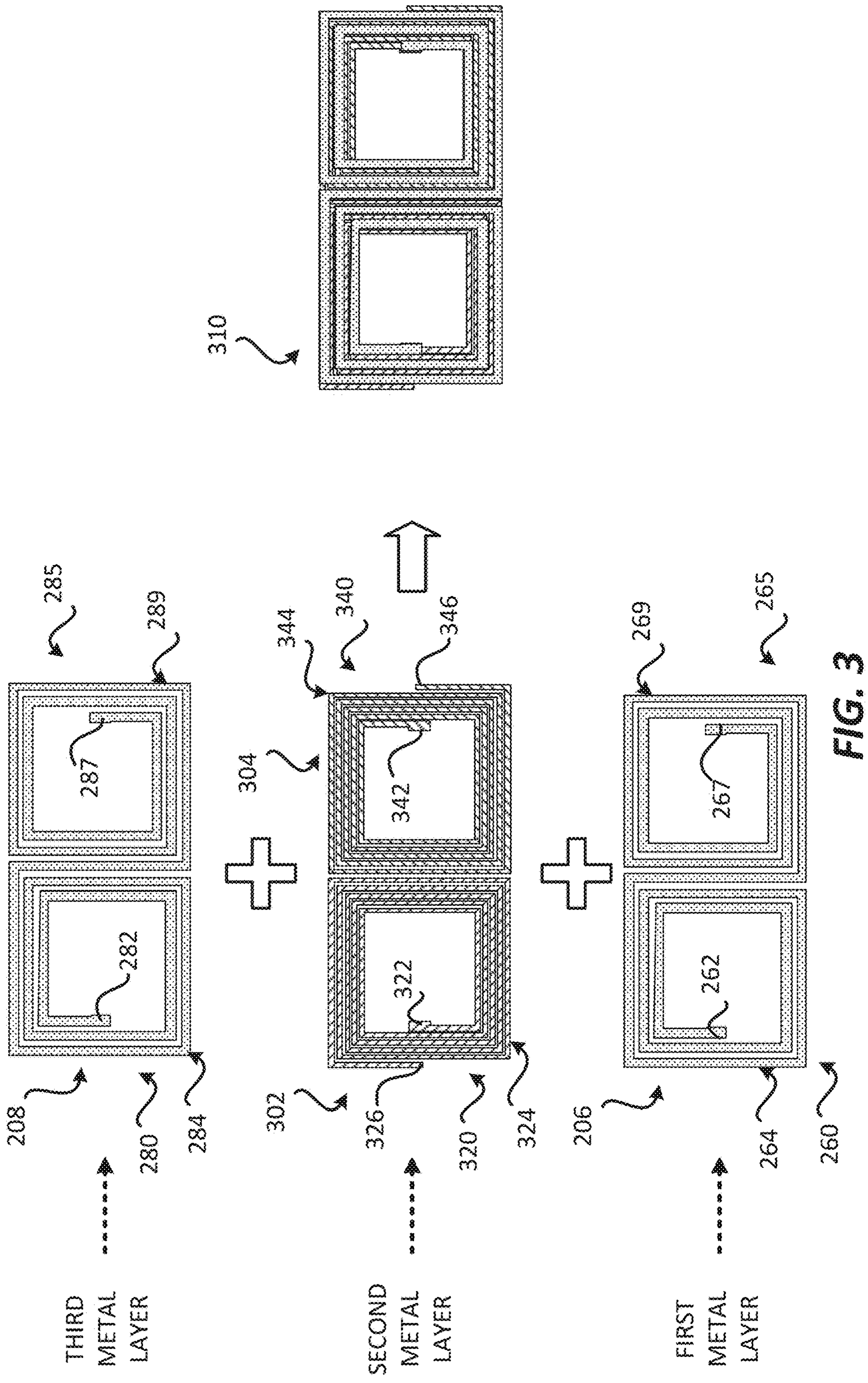
FIG. 3 illustrates an exemplary view of a stacked inductor comprising a figure 8-shaped inductor.

FIG. 3 illustrates an inductor 302, an inductor 304, the inductor 206 and the inductor 208. Some of the inductors are located on different metal layers. For example, the inductor 206 may be located on a first metal layer, the inductor 202 and the inductor 204 may be located on a second metal layer, and the inductor 208 may be located on a third metal layer. FIG. 3 illustrates an example of two figure 8-shaped inductors and/or spirals that are vertically stacked (e.g., stacked figure 8-shaped inductor).

In some implementations, the inductor 302, the inductor 304, the inductor 206 and the inductor 208 may be coupled together in shunt and/or series. In some implementations, the inductor 302, the inductor 304, the inductor 206 and the inductor 208 may be configured to operate as one inductor.

The inductor 302 is laterally adjacent to the inductor 304. The inductor 302 includes a spiral 320, an origin 322, a tail 324 and a tail terminal 326. The spiral 320 may include the origin 322, the tail 324 and the tail terminal 326. The inductor 304 includes a spiral 340, an origin 342, a tail 344 and a tail terminal 346. The spiral 340 may include the origin 342, the tail 344 and the tail terminal 346. In some implementations, the spiral 320 may have a second rotational direction (e.g., counter clockwise rotation). In some implementations, the spiral 340 may have a second rotational direction (e.g., counter clockwise rotation). A rotational direction of a spiral may be defined by the origin of the spiral as being the starting point of the spiral. In some implementations, the spiral 320 and/or the spiral 340 have a different rotational direction (e.g., clockwise rotation).

The inductor 206 includes a spiral 260, an origin 262, a tail 264, a spiral 265, an origin 267, and a tail 269. The spiral 260 includes the origin 262 and the tail 264. The spiral 265 includes the origin 267 and the tail 269. The spiral 260 is coupled to the spiral 265. The tail 264 of the spiral 260 is coupled to the tail 269 of the spiral 265. In some implementations, the spiral 260 may have a first rotational direction (e.g., clockwise rotation). In some implementations, the spiral 265 may have a first rotational direction (e.g., clockwise rotation). In some implementations, the spiral 260 and/or the spiral 265 have a different rotational direction (e.g., counter clockwise rotation).

The inductor 208 includes a spiral 280, an origin 282, a tail 284, a spiral 285, an origin 287, and a tail 289. The spiral 280 includes the origin 282 and the tail 284. The spiral 285 includes the origin 287 and the tail 289. The spiral 280 is coupled to the spiral 285. The tail 284 of the spiral 280 is coupled to the tail 289 of the spiral 285. In some implementations, the spiral 280 may have a first rotational direction (e.g., clockwise rotation). In some implementations, the spiral 285 may have a first rotational direction (e.g., counter clockwise rotation). In some implementations, the spiral 280 and/or the spiral 285 have a different rotational direction (e.g., counter clockwise rotation).

In some implementations, an electrical current may travel through the inductor 206 through an electrical path that includes the origin 262, the tail 264, the tail 269 and the origin 267. In some implementations, a current may enter through the origin 262 and exit through the origin 267. In some implementations, a current may enter through the origin 267 and exit through the origin 262. Thus, a current may travel through the spiral 260 and the spiral 265.

In some implementations, an electrical current may travel through the inductor 208 through an electrical path that includes the origin 282, the tail 284, the tail 289 and the origin 287. In some implementations, a current may enter through the origin 282 and exit through the origin 287. In some implementations, a current may enter through the origin 287 and exit through the origin 282. Thus, a current may travel through the spiral 280 and the spiral 285.

The inductor 206, the inductor 208, the inductor 302 and the inductor 304 may form a stacked inductor 310 that includes several spirals, windings and/or turns. The stacked inductor 310 formed from the inductor 206, the inductor 208, the inductor 302 and the inductor 304 may be located on three or more metal layers. The stacked inductor 310 may include two figure 8-shaped spirals. The stacked inductor 310 may include a first figure 8-shaped spiral on a first metal layer and a second figure 8-shaped spiral on a third metal layer.

The inductor 206, the inductor 208, the inductor 302 and the inductor 304 may vertically overlap with each other. In some implementations, the inductor 302 and the inductor 304 are located vertically between the inductor 206 and the inductor 208. In some implementations, the inductor 302 and the inductor 304 are located above the inductor 206 and the inductor 208. In some implementations, the inductor 302 and the inductor 304 are located below the inductor 206 and the inductor 208. In some implementations, the inductor 206 is located above the inductor 208. In some implementations, the inductor 206 is located below the inductor 208. In some implementations, the inductor 206 may have the same design as the inductor 208. In some implementations, the inductor 206 may have a different design from the inductor 208, such as a different spiral, a different number of turns, a different shape, and/or a different size. It is noted that the first metal layer, the second metal layer and/or the third metal layer may be adjacent to each other. However, in some implementations, there may be one or more metal layers between (i) the first metal layer and the second metal layer, (ii) the first metal layer and the third metal layer, and/or (iii) the second metal layer and the third metal layer. For example, in some implementations, the first metal layer may be an M1 metal layer, the second metal layer may be a M2 metal layer, and the third metal layer may be a M3 metal layer. In another example, in some implementations, the first metal layer may be an M4 metal layer, the second metal layer may be a M3 metal layer and the third metal layer may be a M3 metal layer.

Figure 4:
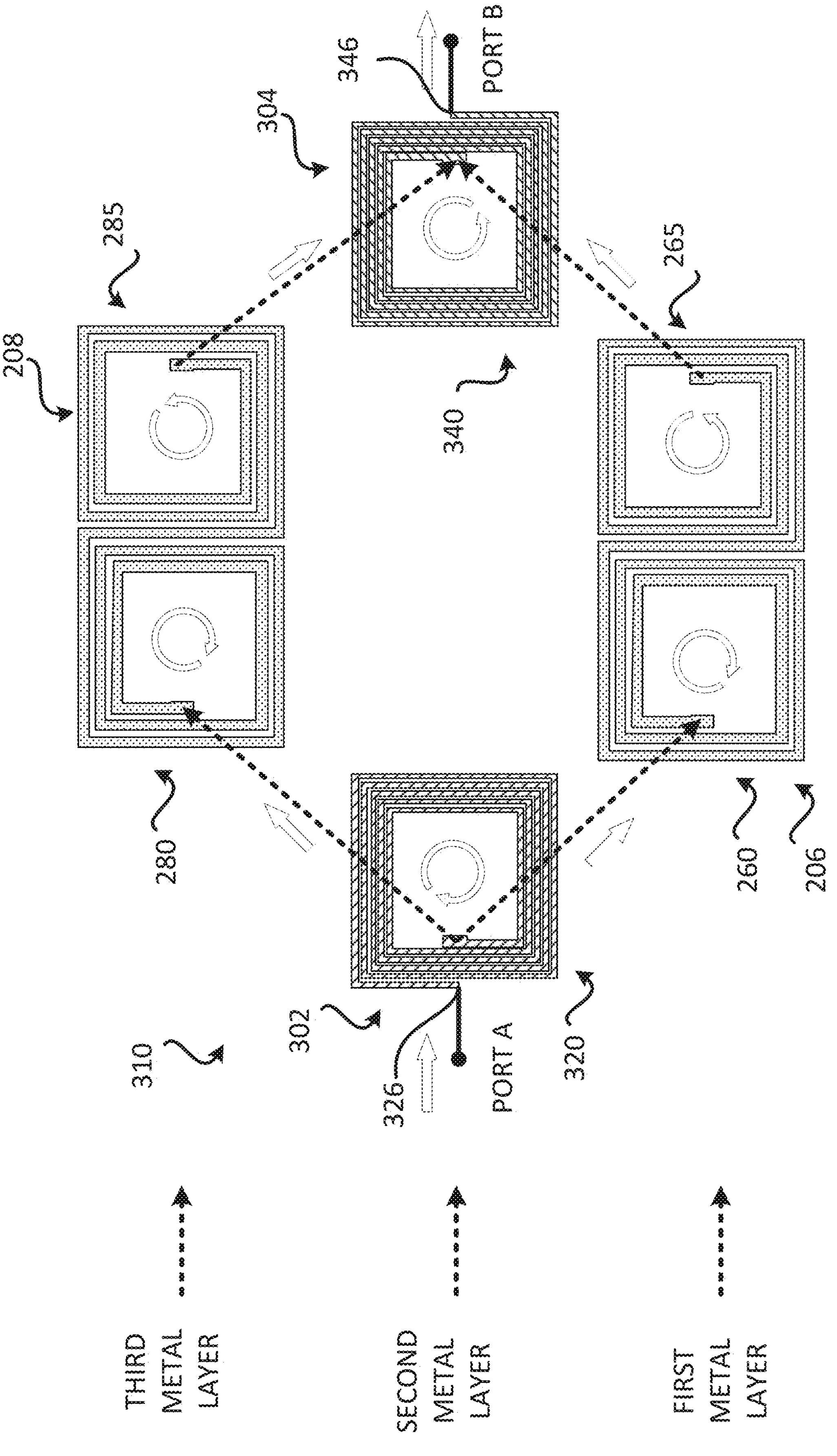
FIG. 4 illustrates an exemplary view of a stacked inductor comprising a figure 8-shaped inductor.

FIG. 4 conceptually illustrates how the inductor 302, the inductor 206, the inductor 208 and the inductor 304 may be coupled together to form the stacked inductor 310. The stacked inductor 310 includes a first figure 8-shaped inductor on a metal layer and a second figure 8-shaped inductor on another metal layer. In the example of FIG. 4, an exemplary current may flow between port A and port B. The exemplary current may enter through port A and exit through port B. In another example, the exemplary current may enter through port B and exit through port A. Port A may be represented by the tail terminal 326. Port B may be represented by the tail terminal 346. At least some of the arrows shown in FIG. 4 may illustrate an example of how a current may flow through the stacked inductor 310.

FIG. 4 illustrates that a current may travel through (i) the inductor 302, (ii) the inductor 206 and the inductor 208 (in parallel), and (iii) the inductor 304. Thus, part of the current travels through the inductor 206 and part of the current travels through the inductor 208. As an example, a current may travel through (i) a first spiral (e.g., 320) of the inductor 302, (ii) a second spiral (e.g., 280) and a third spiral (e.g., 285) of the inductor 208, a fifth spiral (e.g., 260) and a sixth spiral (e.g., 265) of the inductor 206 and (iii) a fourth spiral (e.g., 340) of the inductor 304. A current that flows and/or travels through a second spiral (e.g., 280) and a third spiral (e.g., 285) of the inductor 208 may flow in parallel with a current that flows and/or travels through a fifth spiral (e.g., 260) and a sixth spiral (e.g., 265) of the inductor 206.

In some implementations, a current (e.g., electrical current) may travel through the stacked inductor 310 through an electrical path that includes the tail terminal 326, the tail 324, the origin 322, the origin 282, the tail 284, the tail 289, the origin 287, the origin 342, the tail 344, the tail terminal 346.

In some implementations, a current (e.g., electrical current) may travel through the stacked inductor 310 through an electrical path that includes the tail terminal 326, the tail 324, the origin 322, the origin 262, the tail 264, the tail 269, the origin 267, the origin 342, the tail 344, the tail terminal 346.

The origin 322 may be coupled to the origin 282 through one or more interconnects (e.g., vias, pads, traces). The origin 287 may be coupled to the origin 342 through one or more interconnects (e.g., vias, pads, traces). The origin 322 may be coupled to the origin 262 through one or more interconnects (e.g., vias, pads, traces). The origin 267 may be coupled to the origin 342 through one or more interconnects (e.g., vias, pads, traces).

The design of the stacked inductor 310 may provide high inductance values while occupying a much smaller footprint and/or real estate in the package. This allows the package and/or the integrated device to have a smaller lateral area through the sharing of lateral space and/or vertical stacking with one another, without sacrificing and/or diminishing the performance of the package and/or the integrated device. Thus, the stacked inductor 310 that is located on several metal layers may provide an inductance that is similar to an inductance of a comparable inductor that is larger in lateral size than the stacked inductor 310.

FIG. 4 illustrates an inductor 310 that includes a second spiral (e.g., spiral 280) and a third spiral (e.g., spiral 285) that may form a figure 8-shaped inductor, where a first spiral (e.g., spiral 320) and a fourth spiral (e.g., spiral 340) are the extension series stacking metals to wind out the metal trace to the outer turns. Moreover, the fifth spiral (e.g., spiral 260) and the sixth spiral (e.g., spiral 265) may be the shunt structure (e.g., another figure 8-shaped inductor) of the second spiral (e.g., spiral 280) and the third spiral (e.g., spiral 285) of the inductor 310, which provides lower resistance to improve the quality factor value of the inductor 310.

It is noted that any of the inductors described in the disclosure may have different designs, including different spirals, different numbers of turns, different windings, and/or different crossings. The number of turns in the spiral in the inductors shown in the disclosure are exemplary. Different implementations may have inductors with spirals that have different numbers of turns. The designs of the inductors are not limited to what is shown in the figures of the disclosure. Different implementations may have different designs to form symmetrical inductors to achieve a mutual inductance of zero (0) or near zero.

Figure 5:
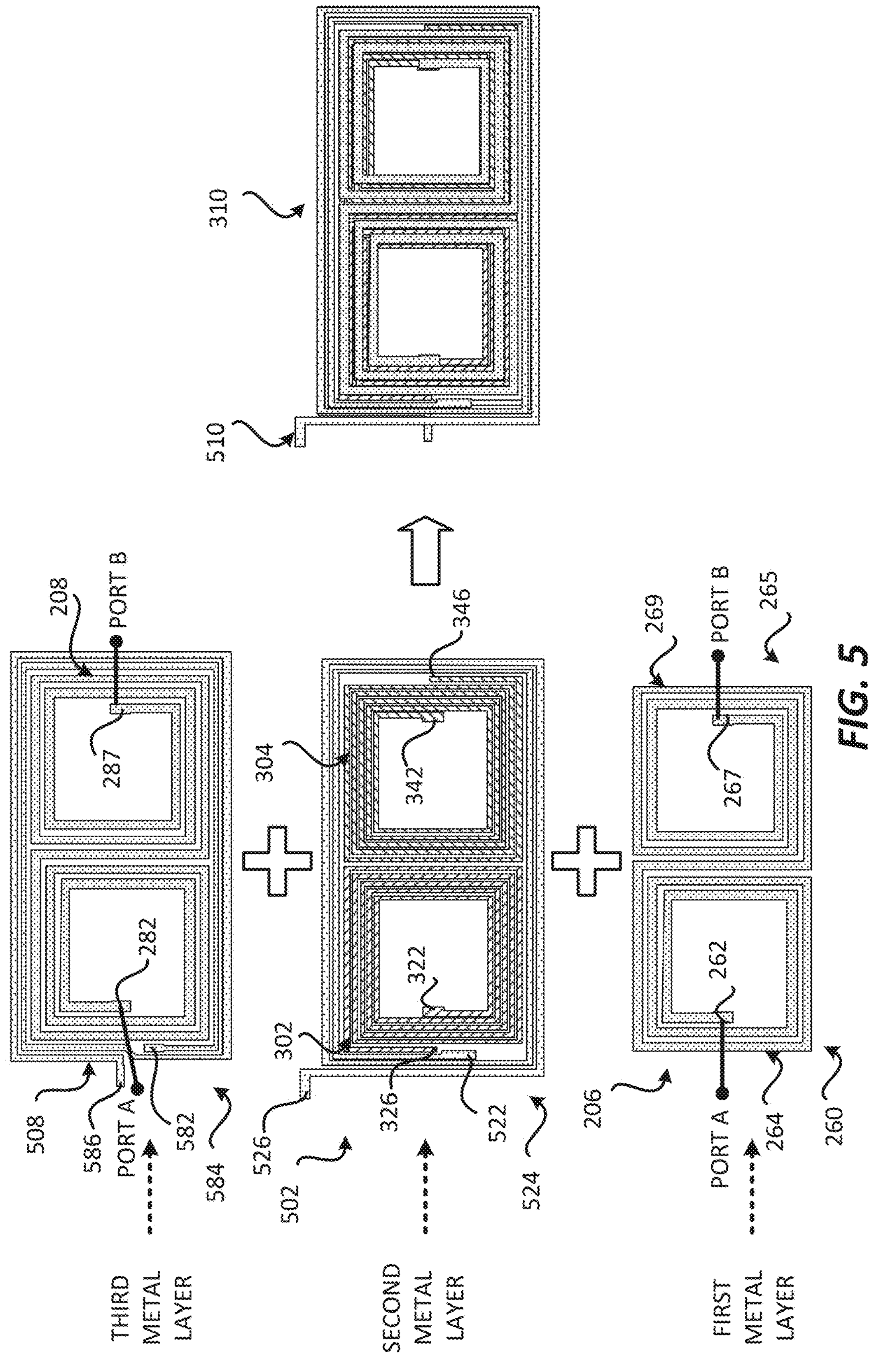
FIG. 5 illustrates an exemplary view of two inductors, where one of the inductors includes a stacked inductor comprising a figure 8-shaped inductor.

FIG. 5 illustrates two stacked inductors. The two stacked inductors may be configured to operate as a transformer. FIG. 5 illustrates the stacked inductor 310 and a stacked inductor 510. The stacked inductor 310 includes the inductor 206, the inductor 208, the inductor 302 and the inductor 304. FIGS. 3 and 4 illustrate and describe how the stacked inductor 310 may be formed and/or defined by the inductor 206, the inductor 208, the inductor 302 and the inductor 304.

The stacked inductor 510 includes an inductor 502 and an inductor 508. The inductor 502 is located on the second metal layer and the inductor 508 is located on the third metal layer. In some implementations, the inductor 502 may be located on the second metal layer and the inductor 508 may be located on the first metal layer. In some implementations, the inductor 502 may be located on the first metal layer and the inductor 508 may be located on the first metal layer. In some implementations, the inductor 502 may be located on the first metal layer and the inductor 508 may be located on the second metal layer.

The inductor 502 includes a spiral 520, an origin 522, a tail 524 and a tail terminal 526. The spiral 520 may include the origin 522, the tail 524 and the tail terminal 526. In some implementations, the spiral 520 may have a second rotational direction (e.g., counter clockwise rotation). A rotational direction of a spiral may be defined by the origin of the spiral as being the starting point of the spiral. In some implementations, the spiral 520 has a different rotational direction (e.g., clockwise rotation). The inductor 502 laterally surrounds the inductor 302 and the inductor 304, on the second metal layer.

The inductor 508 includes a spiral 580, an origin 582, a tail 584 and a tail terminal 586. The spiral 580 may include the origin 582, the tail 584 and the tail terminal 586. In some implementations, the spiral 580 may have a second rotational direction (e.g., counter clockwise rotation). A rotational direction of a spiral may be defined by the origin of the spiral as being the starting point of the spiral. In some implementations, the spiral 580 has a different rotational direction (e.g., clockwise rotation). The inductor 508 laterally surrounds the inductor 208, on the third metal layer.

The inductor 502 may be coupled (e.g., electrically coupled) to the inductor 508 through one or more interconnects (e.g., vias, pads, traces) to form the stacked inductor 510. In some implementations, a current that flows and/or travels through the stacked inductor 310 may induce a current through the stacked inductor 510. Similarly, in some implementations, a current that flows and/or travels through the stacked inductor 510 may induce a current through the stacked inductor 310. The stacked inductor 310 and the stacked inductor 510 may have a mutual inductance (e.g., coefficient of coupling K) in a range of about 0-0.1.

Figure 6:
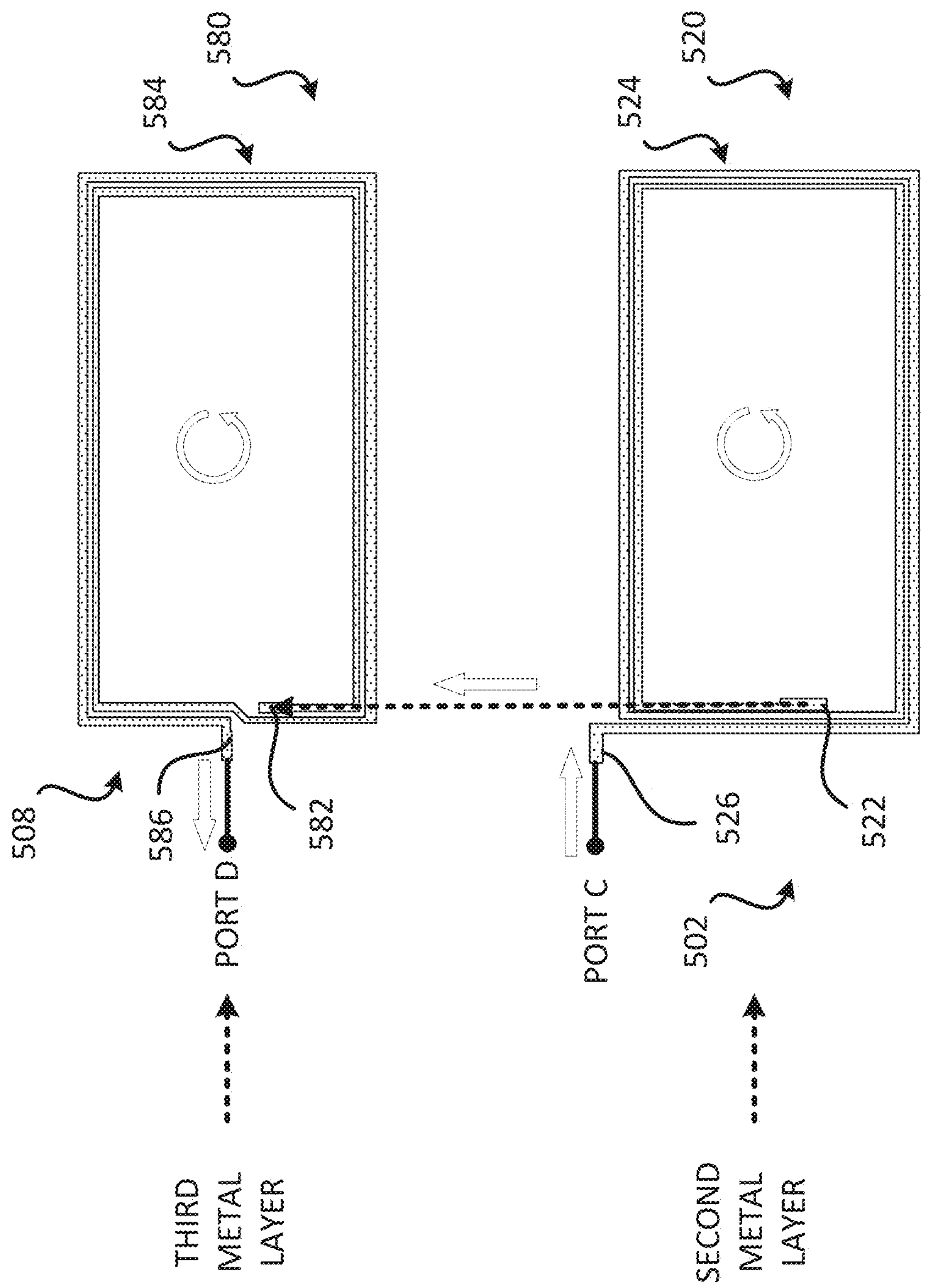
FIG. 6 illustrates an exemplary view of a stacked inductor that includes a first spiral and a second spiral.

FIG. 6 conceptually illustrates how the inductor 502 and the inductor 508 may be coupled together to form the stacked inductor 510. In the example of FIG. 6, an exemplary current may flow between port C and port D. The exemplary current may enter through port C and exit through port D. In another example, the exemplary current may enter through port D and exit through port C. Port C may be represented by the tail terminal 526. Port D may be represented by the tail terminal 586. At least some of the arrows shown in FIG. 6 may illustrate an example of how a current may flow through the stacked inductor 510.

FIG. 6 illustrates that a current may travel through the inductor 502 and the inductor 508. As an example, a current may flow and/or travel through (i) a first spiral (e.g., 520) of the inductor 302 and (ii) a second spiral (e.g., 580) of the inductor 508. Moreover specifically for example, a current may flow and/or travel through the tail terminal 526, the tail 524, the origin 522, the origin 582, the tail 584 and the tail terminal 586. As mentioned above, the inductor 502 may be coupled (e.g., electrically coupled) to the inductor 508 through one or more interconnects (e.g., vias, pads, traces). For example, the origin 522 may be coupled to the origin 582 through one or more interconnects (e.g., vias, pads, traces). It is noted that the second metal layer and the third metal layer may be adjacent to each other. However, in some implementations, there may be one or more metal layers between the second metal layer and the third metal layer. In some implementations, the second metal layer may be below the third metal layer. In some implementations, the second metal layer may be above the third metal layer.

The inductors (e.g., 202, 206, 208, 302, 304, 502, 508) and/or stacked inductors (e.g., 210, 310, 510, 910, 920, 1010, 1020, 1110, 1310) of the disclosure may be implemented in any metal layers of a package, any metal layers of an integrated device and/or any metal layers of a substrate.

As mentioned above, a figure 8-shaped inductor design as described in the disclosure, may have 2 coils (e.g., spirals), where each coil has a different current orientation. Any coupled signal that has been induced on these 2 coils, will be cancelled due to the 2 induced currents that are formed in different orientation and/or direction. Thus, the use of placing one figure 8-shaped inductor with another spiral inductor provides an inductor with little or no mutual inductance due to the fundamental of the figure 8-shaped inductor, while still providing a high Q factor inductor, based on the shunt structure of a first metal layer and another metal layer. Moreover, the use of series stacked 8-shaped inductors as described in any of the inductors of the disclosure, helps provide an inductor with a high inductance, while having a small form factor, which is formed based on a structure that combines 2 different inductor structures.

Figure 7:
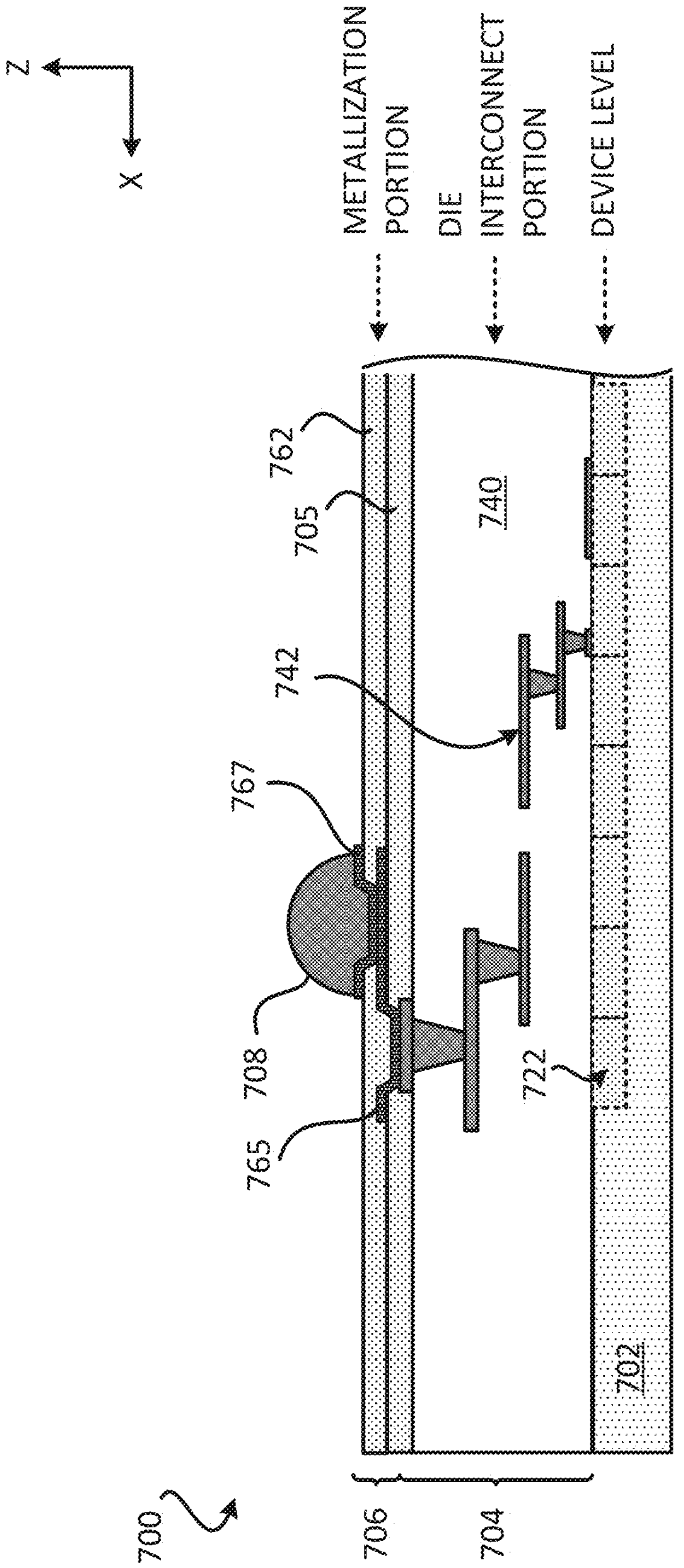
FIG. 7 illustrates a profile cross sectional view of an exemplary integrated device that can include two inductors, where one of the inductors includes a stacked inductor comprising a figure 8-shaped inductor.

FIG. 7 illustrates a cross sectional profile view of an integrated device 700. The integrated device 700 may represent the integrated device 103 of FIG. 1. The integrated device 700 includes a die substrate 702, a die interconnection portion 704, a metallization portion 706. A plurality of solder interconnects 708 may be coupled to the metallization portion 706.

The die substrate 702 may include silicon (Si). A plurality of cells (e.g., logic cells) and/or a plurality of transistors (not shown) may be formed in and/or over the die substrate 702. The plurality of cells (e.g., logic cells) and/or a plurality of transistors (not shown) may be part of the device level 722 of the integrated device 700. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 702. Although not shown, the die substrate 702 may include through substrate vias. Moreover, one or more metal layers (not shown and which may form back side interconnects) may be coupled to the back side of the die substrate 702. These back side interconnects may be coupled to the through substrate vias. The interconnection portion 704 is located over and coupled to the die substrate 702. The interconnection portion 704 may be coupled to the plurality of cells and/or transistors located in and/or over the die substrate 702. The interconnection portion 704 (e.g., die interconnection portion) may include at least one dielectric layer 740 (e.g., die dielectric layer) and a plurality of die interconnects 742. The plurality of die interconnects 742 may be coupled to the plurality of cells and/or transistors. In some implementations, a back end of line (BEOL) process may be used to fabricate the interconnection portion 704. The interconnection portion 704 may include a passivation layer 705. The passivation layer 705 may be located over the at least one dielectric layer 740.

The metallization portion 706 is coupled to the interconnection portion 704. The metallization portion 706 includes a plurality of metallization interconnects 765, a plurality of under bump metallization interconnects 767 and a dielectric layer 762. The plurality of metallization interconnects 765 are coupled to the plurality of die interconnects 742. The plurality of metallization interconnects 765 may include a plurality of redistribution interconnects. The plurality of under bump metallization interconnects 767 are coupled to the plurality of metallization interconnects 765. The plurality of solder interconnects 708 are coupled to the plurality of under bump metallization interconnects 767.

The metallization portion 706 may be optional. In such instances, the plurality of solder interconnects 708 may be coupled to the plurality of die interconnects 742 (e.g., directly coupled to pad interconnects from the plurality of die interconnects 742).

The inductors (e.g., 202, 206, 208, 302, 304, 502, 508) and/or stacked inductors (e.g., 210, 310, 510, 910, 920, 1010, 1020, 1110, 1310) of the disclosure may be implemented in any metal layers of the integrated device 700. In some implemented, a first inductor and a second inductor are both implemented in the interconnection portion 704 of the integrated device 700. In some implemented, a first inductor and a second inductor are both implemented in the metallization portion 706 of the integrated device 700. In some implemented, a first inductor is implemented in the interconnection portion 704 of the integrated device 700, and a second inductor is implemented in the metallization portion 706. In some implementations, a first inductor and/or a second inductor may be implemented on the back side of the die substrate 702. The integrated device 700 may be coupled to a substrate (e.g., 102) or a board (e.g., 108). In some implementations, there may be a plurality of pillar interconnects between the plurality of solder interconnects 708 and the plurality of under bump metallization interconnects 767.

In some implementations, the vias for inductors may be implemented as through substrate vias in a die substrate. In some implementations, the vias for inductors may be implemented as vias in a die interconnection portion of an integrated device. In some implementations, vias for inductors may be implemented in in a metallization portion. In some implementations, vias for inductors may be implemented as vias in a substrate. In some implementations, vias for inductors may be implemented as vias in a board. In some implementations, vias for inductors may be replaced with or used in conjunction with solder interconnects and/or pillar interconnects.

FIG. 8 illustrates a package 800 that includes an integrated device 103, a metallization portion 802 and an encapsulation layer 806. The metallization portion 802 includes at least one dielectric layer 820 and a plurality of metallization interconnects 822. The metallization portion 802 may include a redistribution portion. The package 800 is coupled to the board 108 through a plurality of solder interconnects 101.

The inductors (e.g., 202, 206, 208, 302, 304, 502, 508) and/or stacked inductors (e.g., 210, 310, 510, 910, 920, 1010, 1020, 1110, 1310) of the disclosure may be implemented in the integrated device 103 of the package 800. In some implemented, a first inductor and a second inductor are both implemented in the metallization portion 802 of the package 800. In some implemented, a first inductor is implemented in the integrated device 103, and a second inductor is implemented in the metallization portion 802 of the package 800.

As mentioned above, different implementations may have different designs and/or configurations for inductors. FIGS. 9-14 illustrate other examples of inductors that may be implemented in a package, in a similar fashion as described.

Figure 9:
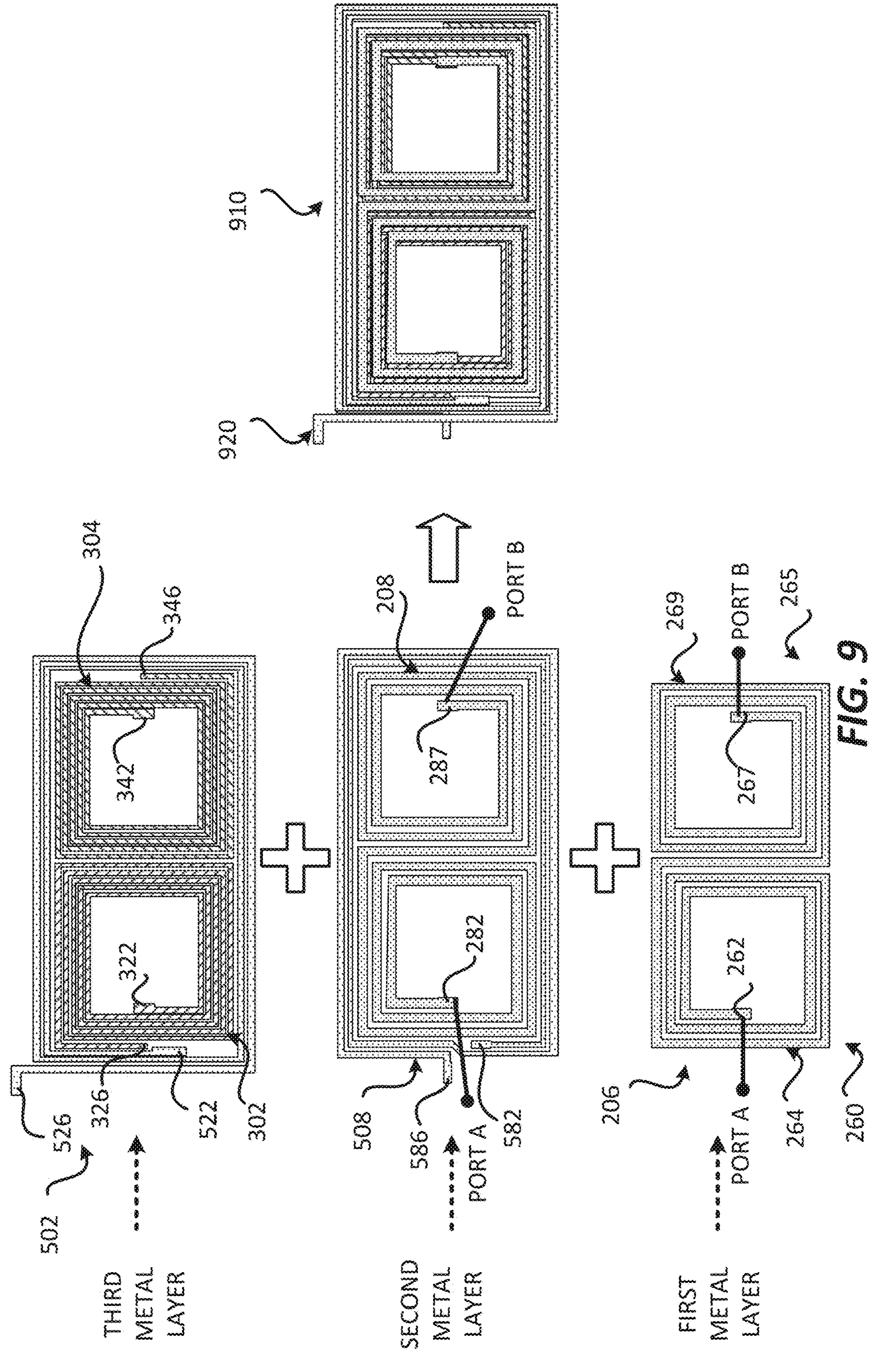
FIG. 9 illustrates an exemplary view of two inductors, where one of the inductors includes a stacked inductor comprising a figure 8-shaped inductor.

FIG. 9 illustrates two stacked inductors. The two stacked inductors may be configured to operate as a transformer. FIG. 9 illustrates a stacked inductor 910 and a stacked inductor 920. The stacked inductor 910 includes the inductor 206, the inductor 208, the inductor 302 and the inductor 304. The stacked inductor 910 is similar to the stacked inductor 310 of FIGS. 3 and 4. The inductor 206, the inductor 208, the inductor 302 and/or the inductor 304 of the stacked inductor 910 may be located on different metal layers. The inductor 302 and the inductor 304 are located on the third metal layer. The inductor 206 is located on the first metal layer. The inductor 208 is located on the second metal layer. It is noted that the inductor 206, the inductor 208, the inductor 302, and the inductor 304 may be electrically coupled together in a similar manner, as described for the stacked inductor 310.

In some implementations, for the stacked inductor 910, a current may travel through (i) the inductor 302, (ii) the inductor 206 and the inductor 208 (in parallel), and (iii) the inductor 304. Thus, part of the current travels through the inductor 206 and part of the current travels through the inductor 208. As an example, a current may travel through (i) a first spiral (e.g., 320) of the inductor 302, (ii) a second spiral (e.g., 280) and a third spiral (e.g., 285) of the inductor 208, a fifth spiral (e.g., 260) and a sixth spiral (e.g., 265) of the inductor 206 and (iii) a fourth inductor (e.g., 340) of the inductor 304. A current that flows and/or travels through a second spiral (e.g., 280) and a third spiral (e.g., 285) of the inductor 208 may flow in parallel with a current that flows and/or travels through a fifth spiral (e.g., 260) and a sixth spiral (e.g., 265) of the inductor 206.

In some implementations, for the stacked inductor 910, a current (e.g., electrical current) may travel through the stacked inductor 910 through an electrical path that includes the tail terminal 326, the tail 324, the origin 322, the origin 282, the tail 284, the tail 289, the origin 287, the origin 342, the tail 344, the tail terminal 346.

In some implementations, for the stacked inductor 910, a current (e.g., electrical current) may travel through the stacked inductor 910 through an electrical path that includes the tail terminal 326, the tail 324, the origin 322, the origin 262, the tail 264, the tail 269, the origin 267, the origin 342, the tail 344, the tail terminal 346.

The origin 322 may be coupled to the origin 282 through one or more interconnects (e.g., vias, pads, traces). The origin 287 may be coupled to the origin 342 through one or more interconnects (e.g., vias, pads, traces). The origin 322 may be coupled to the origin 262 through one or more interconnects (e.g., vias, pads, traces). The origin 267 may be coupled to the origin 342 through one or more interconnects (e.g., vias, pads, traces).

The stacked inductor 920 includes the inductor 502 and the inductor 508. The stacked inductor 920 is similar to the stacked inductor 510 of FIGS. 5 and 6. The inductor 502 and/or the inductor 508 may be located on different metal layers. The inductor 508 is located on the second metal layer. The inductor 502 is located on the third metal layer. It is noted that the inductor 502 and the inductor 508 may be electrically coupled together in a similar manner, as described for the stacked inductor 920.

In some implementations, for the stacked inductor 920, a current may flow and/or travel through (i) a first spiral (e.g., 520) of the inductor 302 and (ii) a second spiral (e.g., 580) of the inductor 508. Moreover specifically for example, a current may flow and/or travel through the tail terminal 526, the tail 524, the origin 522, the origin 582, the tail 584 and the tail terminal 586. As mentioned above, the inductor 502 may be coupled (e.g., electrically coupled) to the inductor 508 through one or more interconnects (e.g., vias, pads, traces). For example, the origin 522 may be coupled to the origin 582 through one or more interconnects (e.g., vias, pads, traces).

In some implementations, a current that flows and/or travels through the stacked inductor 910 may induce a current through the stacked inductor 920. Similarly, in some implementations, a current that flows and/or travels through the stacked inductor 920 may induce a current through the stacked inductor 910. The stacked inductor 910 and the stacked inductor 920 may have a mutual inductance (e.g., coefficient of coupling K) in a range of about 0-0.1.

Figure 10:
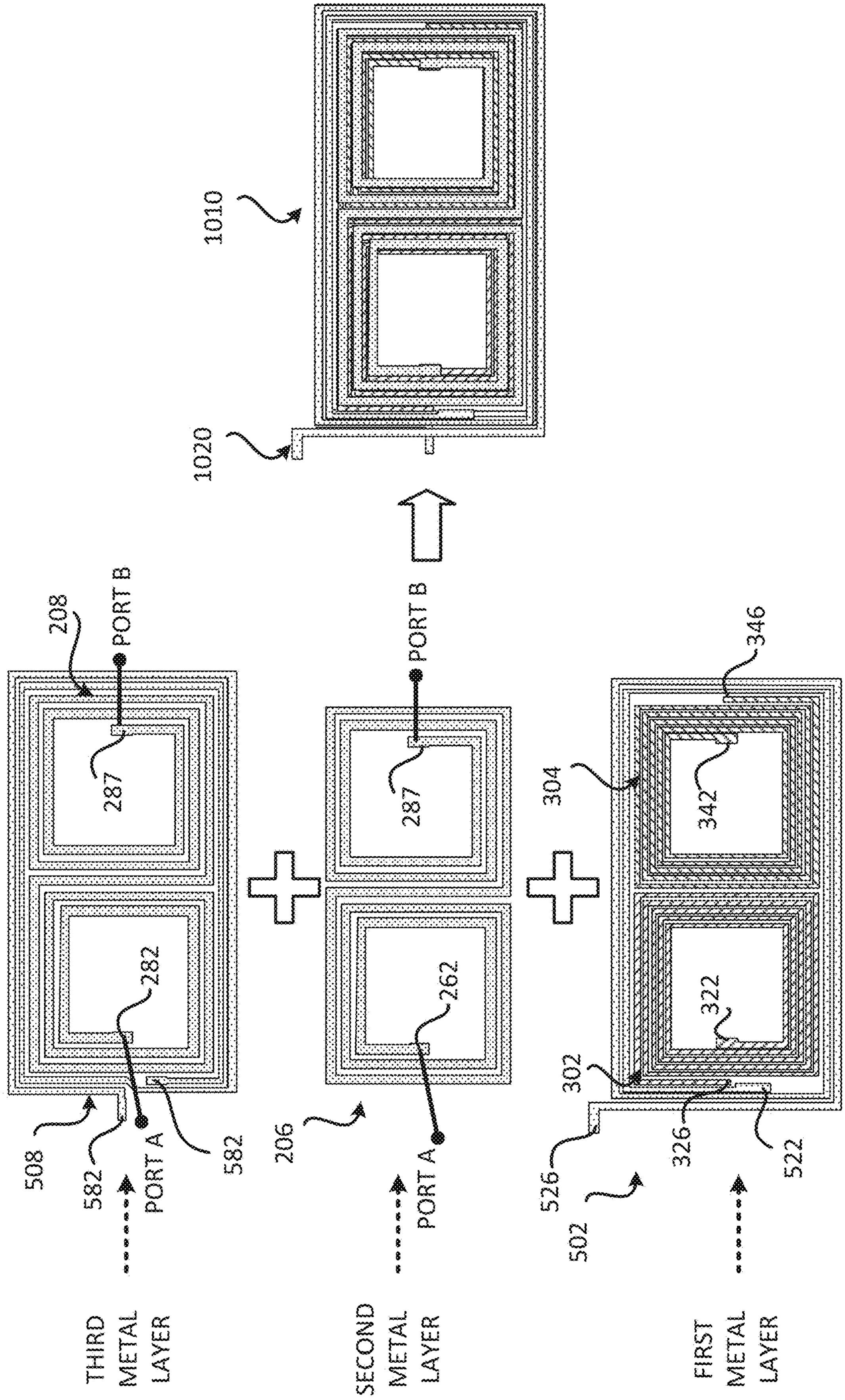
FIG. 10 illustrates an exemplary view of two inductors, where one of the inductors includes a stacked inductor comprising a figure 8-shaped inductor.

FIG. 10 illustrates two stacked inductors. The two stacked inductors may be configured to operate as a transformer. FIG. 10 illustrates a stacked inductor 1010 and a stacked inductor 1020. The stacked inductor 1010 includes the inductor 206, the inductor 208, the inductor 302 and the inductor 304. The stacked inductor 1010 is similar to the stacked inductor 310 of FIGS. 3 and 4. The inductor 206, the inductor 208, the inductor 302 and/or the inductor 304 of the stacked inductor 1010 may be located on different metal layers. The inductor 302 and the inductor 304 are located on the first metal layer. The inductor 206 is located on the second metal layer. The inductor 208 is located on the third metal layer. It is noted that the inductor 206, the inductor 208, the inductor 302, and the inductor 304 may be electrically coupled together in a similar manner, as described for the stacked inductor 310.

In some implementations, for the stacked inductor 1010, a current may travel through (i) the inductor 302, (ii) the inductor 206 and the inductor 208 (in parallel), and (iii) the inductor 304. Thus, part of the current travels through the inductor 206 and part of the current travels through the inductor 208. As an example, a current may travel through (i) a first spiral (e.g., 320) of the inductor 302, (ii) a second spiral (e.g., 280) and a third spiral (e.g., 285) of the inductor 208, a fifth spiral (e.g., 260) and a sixth spiral (e.g., 265) of the inductor 206 and (iii) a fourth spiral (e.g., 340) of the inductor 304. A current that flows and/or travels through a second spiral (e.g., 280) and a third spiral (e.g., 285) of the inductor 208 may flow in parallel with a current that flows and/or travels through a fifth spiral (e.g., 260) and a sixth spiral (e.g., 265) of the inductor 206.

In some implementations, for the stacked inductor 1010, a current (e.g., electrical current) may travel through the stacked inductor 1010 through an electrical path that includes the tail terminal 326, the tail 324, the origin 322, the origin 282, the tail 284, the tail 289, the origin 287, the origin 342, the tail 344, the tail terminal 346.

In some implementations, for the stacked inductor 1010, a current (e.g., electrical current) may travel through the stacked inductor 1010 through an electrical path that includes the tail terminal 326, the tail 324, the origin 322, the origin 262, the tail 264, the tail 269, the origin 267, the origin 342, the tail 344, the tail terminal 346.

The origin 322 may be coupled to the origin 282 through one or more interconnects (e.g., vias, pads, traces). The origin 287 may be coupled to the origin 342 through one or more interconnects (e.g., vias, pads, traces). The origin 322 may be coupled to the origin 262 through one or more interconnects (e.g., vias, pads, traces). The origin 267 may be coupled to the origin 342 through one or more interconnects (e.g., vias, pads, traces).

The stacked inductor 1020 includes the inductor 502 and the inductor 508. The stacked inductor 1020 is similar to the stacked inductor 510 of FIGS. 5 and 6. The inductor 502 and/or the inductor 508 may be located on different metal layers. The inductor 508 is located on the third metal layer. The inductor 502 is located on the first metal layer. It is noted that the inductor 502 and the inductor 508 may be electrically coupled together in a similar manner, as described for the stacked inductor 1020.

In some implementations, for the stacked inductor 1020, a current may flow and/or travel through (i) a first spiral (e.g., 520) of the inductor 302 and (ii) a second spiral (e.g., 580) of the inductor 508. Moreover specifically for example, a current may flow and/or travel through the tail terminal 526, the tail 524, the origin 522, the origin 582, the tail 584 and the tail terminal 586. As mentioned above, the inductor 502 may be coupled (e.g., electrically coupled) to the inductor 508 through one or more interconnects (e.g., vias, pads, traces). For example, the origin 522 may be coupled to the origin 582 through one or more interconnects (e.g., vias, pads, traces).

In some implementations, a current that flows and/or travels through the stacked inductor 1010 may induce a current through the stacked inductor 1020. Similarly, in some implementations, a current that flows and/or travels through the stacked inductor 1020 may induce a current through the stacked inductor 1010. The stacked inductor 1010 and the stacked inductor 1020 may have a mutual inductance (e.g., coefficient of coupling K) in a range of about 0-0.1.

Figure 11:
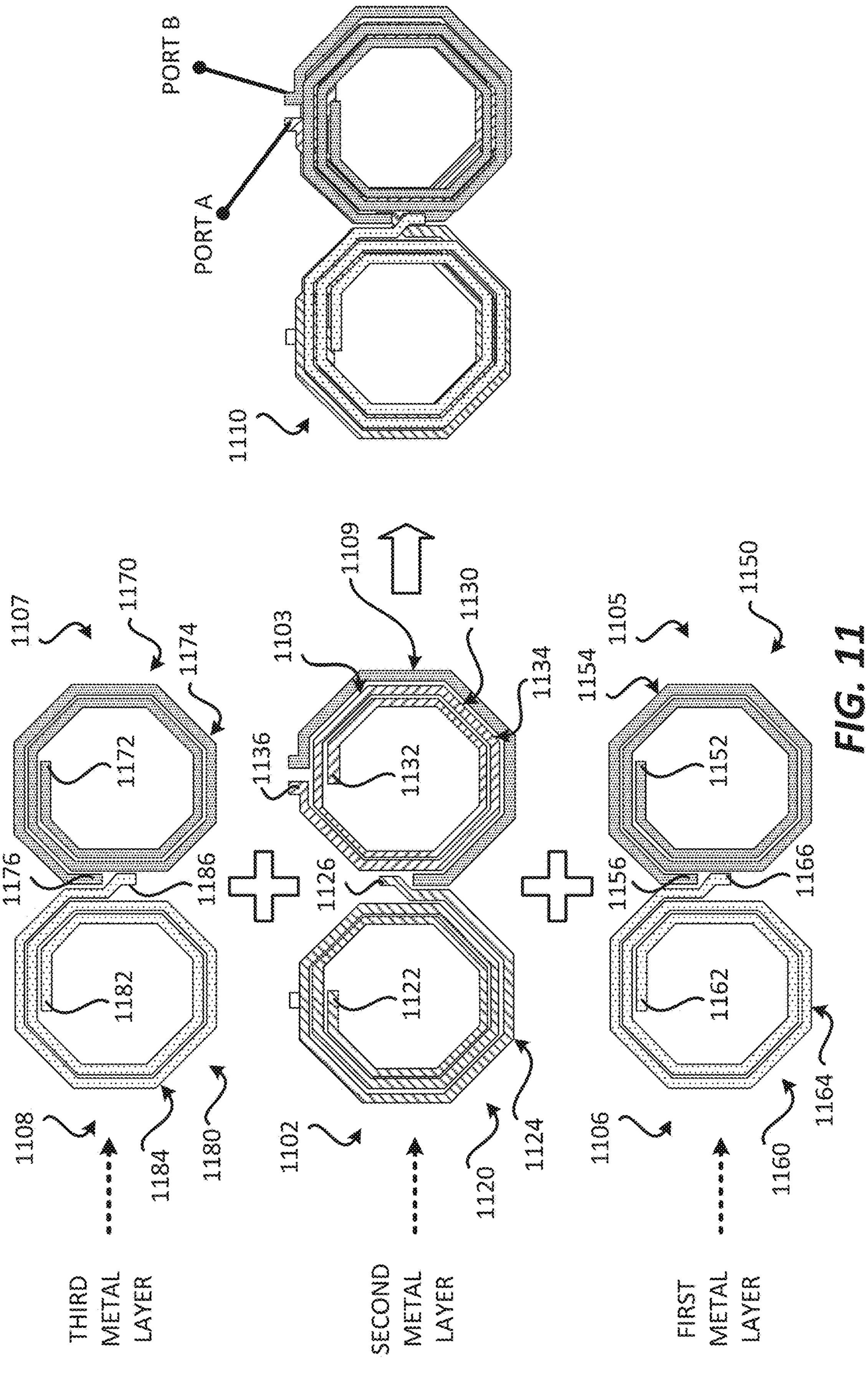
FIG. 11 illustrates an exemplary view of a stacked inductor comprising a figure 8-shaped inductor.

FIG. 11 illustrates an inductor 1102, an inductor 1103, an inductor 1105, an inductor 1106, an inductor 1107, an inductor 1108, and an inductor 1109. Some of the inductors are located on different metal layers. For example, (i) the inductor 1105 and the inductor 1106 may be located on a first metal layer, (ii) the inductor 1102, the inductor 1103 and the inductor 1109 may be located on a second metal layer, and (iii) the inductor 1107 and the inductor 1108 may be located on a third metal layer. FIG. 11 illustrates an example of at least two figure 8-shaped inductors and/or spirals that are vertically stacked (e.g., stacked figure 8-shaped inductor). The figure 8-shaped inductors may be intertwined over several metal layers. For example, different spirals and/or different inductors from the stacked inductor 1110 may be intertwined.

In some implementations, the inductor 1102, the inductor 1103, the inductor 1105, the inductor 1106, the inductor 1107, the inductor 1108, and/or the inductor 1109 may be coupled together in shunt and/or series. In some implementations, the inductor 1102, the inductor 1103, the inductor 1105, the inductor 1106, the inductor 1107, the inductor 1108, and the inductor 1109 may be configured to operate as one inductor. For example, the inductor 1102, the inductor 1103, the inductor 1105, the inductor 1106, the inductor 1107, the inductor 1108, and/or the inductor 1109 may be configured as a stacked inductor 1110.

The inductor 1102 includes a spiral 1120, an origin 1122, a tail 1124 and a tail terminal 1126. The spiral 1120 may include the origin 1122, the tail 1124 and the tail terminal 1126. In some implementations, the spiral 1120 may have a second rotational direction (e.g., counter clockwise rotation). The inductor 1103 includes a spiral 1130, an origin 1132, a tail 1134 and a tail terminal 1136. The spiral 1130 may include the origin 1132, the tail 1134 and the tail terminal 1136. In some implementations, the spiral 1130 may have a first rotational direction (e.g., clockwise rotation). The inductor 1105 includes a spiral 1150, an origin 1152, a tail 1154 and a tail terminal 1156. The spiral 1150 may include the origin 1152, the tail 1154 and the tail terminal 1156. In some implementations, the spiral 1150 may have a second rotational direction (e.g., counter clockwise rotation). The inductor 1106 includes a spiral 1160, an origin 1162, a tail 1164 and a tail terminal 1166. The spiral 1160 may include the origin 1162, the tail 1164 and the tail terminal 1166. In some implementations, the spiral 1160 may have a first rotational direction (e.g., clockwise rotation). The inductor 1107 includes a spiral 1170, an origin 1172, a tail 1174 and a tail terminal 1176. The spiral 1170 may include the origin 1172, the tail 1174 and the tail terminal 1176. In some implementations, the spiral 1170 may have a second rotational direction (e.g., counter clockwise rotation). The inductor 1108 includes a spiral 1180, an origin 1182, a tail 1184 and a tail terminal 1186. The spiral 1180 may include the origin 1182, the tail 1184 and the tail terminal 1186. In some implementations, the spiral 1180 may have a first rotational direction (e.g., clockwise rotation). A rotational direction of a spiral may be defined by the origin of the spiral as being the starting point of the spiral. In some implementations, the spiral 1120, the spiral 1130, the spiral, 1150, the spiral 1160, the spiral 1170 and/or the spiral 1180 have a different rotational direction.

The inductor 1102, the inductor 1103, the inductor 1105, the inductor 1106, the inductor 1107, the inductor 1108, and/or the inductor 1109 may form a stacked inductor 1110 that includes several spirals, windings and/or turns. The stacked inductor 1110 formed from the inductor 1102, the inductor 1103, the inductor 1105, the inductor 1106, the inductor 1107, the inductor 1108, and/or the inductor 1109 may be located on three or more metal layers. The stacked inductor 1110 may include two figure 8-shaped spirals that are interleaved.

The inductor 1102, the inductor 1106 and/or the inductor 1108 may vertically overlap with each other. The inductor 1103, the inductor 1105, the inductor 1107 and/or the inductor 1109 may vertically overlap with each other.

It is noted that the first metal layer, the second metal layer and/or the third metal layer may be adjacent to each other. However, in some implementations, there may be one or more metal layers between (i) the first metal layer and the second metal layer, (ii) the first metal layer and the third metal layer, and/or (iii) the second metal layer and the third metal layer. For example, in some implementations, the first metal layer may be an M1 metal layer, the second metal layer may be a M2 metal layer, and the third metal layer may be a M3 metal layer. In another example, in some implementations, the first metal layer may be an M4 metal layer, the second metal layer may be a M3 metal layer and the third metal layer may be a M3 metal layer.

Figure 12:
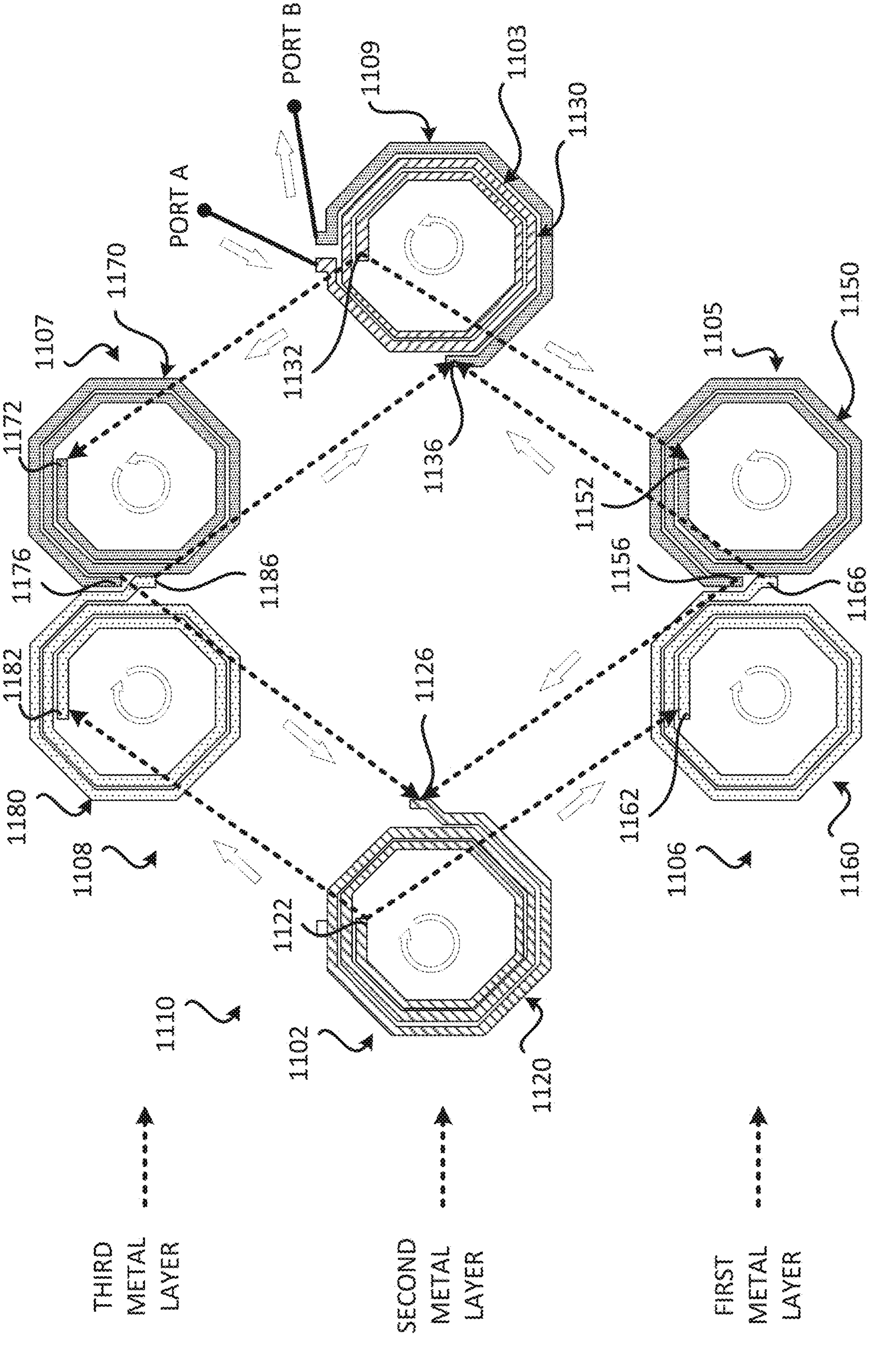
FIG. 12 illustrates an exemplary view of a stacked inductor comprising a figure 8-shaped inductor.

FIG. 12 conceptually illustrates how the inductor 1102, the inductor 1103, the inductor 1105, the inductor 1106, the inductor 1107, the inductor 1108, and/or the inductor 1109 may be coupled together to form the stacked inductor 1110. The stacked inductor 1110 includes a first figure 8-shaped inductor and a second figure 8-shaped inductor that are interleaved. In the example of FIG. 12, an exemplary current may flow between port A and port B. The exemplary current may enter through port A and exit through port B. In another example, the exemplary current may enter through port B and exit through port A. Port A may be represented by the tail terminal 1126 of the inductor 1102. Port B may be represented by a terminal of the inductor 1109. At least some of the arrows shown in FIG. 12 may illustrate an example of how a current may flow through the stacked inductor 1110.

FIG. 12 illustrates that a current may travel through (i) the inductor 1103, (ii) the inductor 1105 and the inductor 1107 (in parallel), (iii) the inductor 1102, (iv) the inductor 1106 and the inductor 1108 (in parallel), and (v) the inductor 1109. Thus, part of the current travels through the inductor 1105 and part of the current travels through the inductor 1107. Similarly, part of the current travels through the inductor 1106 and part of the current travels through the inductor 1108.

As an example, a current may travel through (i) a first spiral (e.g., 1130) of the inductor 1103, (ii) a second spiral (e.g., 1150) of the inductor 1105 and a third spiral (e.g., 1170) of the inductor 1107, (iii) a fourth spiral (e.g., 1120) of the inductor 1102, (iv) a fifth spiral (e.g., 1160) of the inductor 1106 and a sixth spiral (e.g., 1180) of the inductor 1106 and (v) the inductor 1109. A current that flows and/or travels through a second spiral (e.g., 1150) of the inductor 1105 may flow in parallel with a current that flows and/or travels through a third spiral (e.g., 1170) of the inductor 1107. A current that flows and/or travels through a fifth spiral (e.g., 1160) of the inductor 1106 may flow in parallel with a current that flows and/or travels through a sixth spiral (e.g., 1180) of the inductor 1108.

In some implementations, a current (e.g., electrical current) may travel through the stacked inductor 1110 through an electrical path that includes the tail terminal 1136, the tail 1134, the origin 1132, the origin 1152, the tail 1154, the tail terminal 1156, the tail terminal 1126, the tail 1124, the origin 1122, the origin 1162, the tail 1164, the tail terminal 1166 and the inductor 1109.

In some implementations, a current (e.g., electrical current) may travel through the stacked inductor 1110 through an electrical path that includes the tail terminal 1136, the tail 1134, the origin 1132, the origin 1172, the tail 1174, the tail terminal 1176, the tail terminal 1126, the tail 1124, the origin 1122, the origin 1182, the tail 1184, the tail terminal 1186 and the inductor 1109.

FIG. 12 illustrates various crossing between spirals and/or inductors in the stacked inductors. One or more crossings between spirals and/or inductors may be facilitated by one or more interconnects (e.g., vias, pads, traces). The origin 1132 may be coupled to the origin 1152 through one or more interconnects (e.g., vias, pads, traces). The origin 1132 may be coupled to the origin 1172 through one or more interconnects (e.g., vias, pads, traces). The tail terminal 1156 may be coupled to the tail terminal 1126 through one or more interconnects (e.g., vias, pads, traces). The tail terminal 1176 may be coupled to the tail terminal 1126 through one or more interconnects (e.g., vias, pads, traces). The origin 1122 may be coupled to the origin 1162 through one or more interconnects (e.g., vias, pads, traces). The origin 1122 may be coupled to the origin 1182 through one or more interconnects (e.g., vias, pads, traces). The tail terminal 1166 may be coupled to the inductor 1109 through one or more interconnects (e.g., vias, pads, traces). The tail terminal 1186 may be coupled to the inductor 1109 through one or more interconnects (e.g., vias, pads, traces).

The design of the stacked inductor 1110 may provide high inductance values while occupying a much smaller footprint and/or real estate in the package. This allows the package and/or the integrated device to have a smaller lateral area through the sharing of lateral space and/or vertical stacking with one another, without sacrificing and/or diminishing the performance of the package and/or the integrated device. Thus, the stacked inductor 1110 that is located on several metal layers may provide an inductance that is similar to an inductance of a comparable inductor that is larger in lateral size than the stacked inductor 1110.

Figure 13:
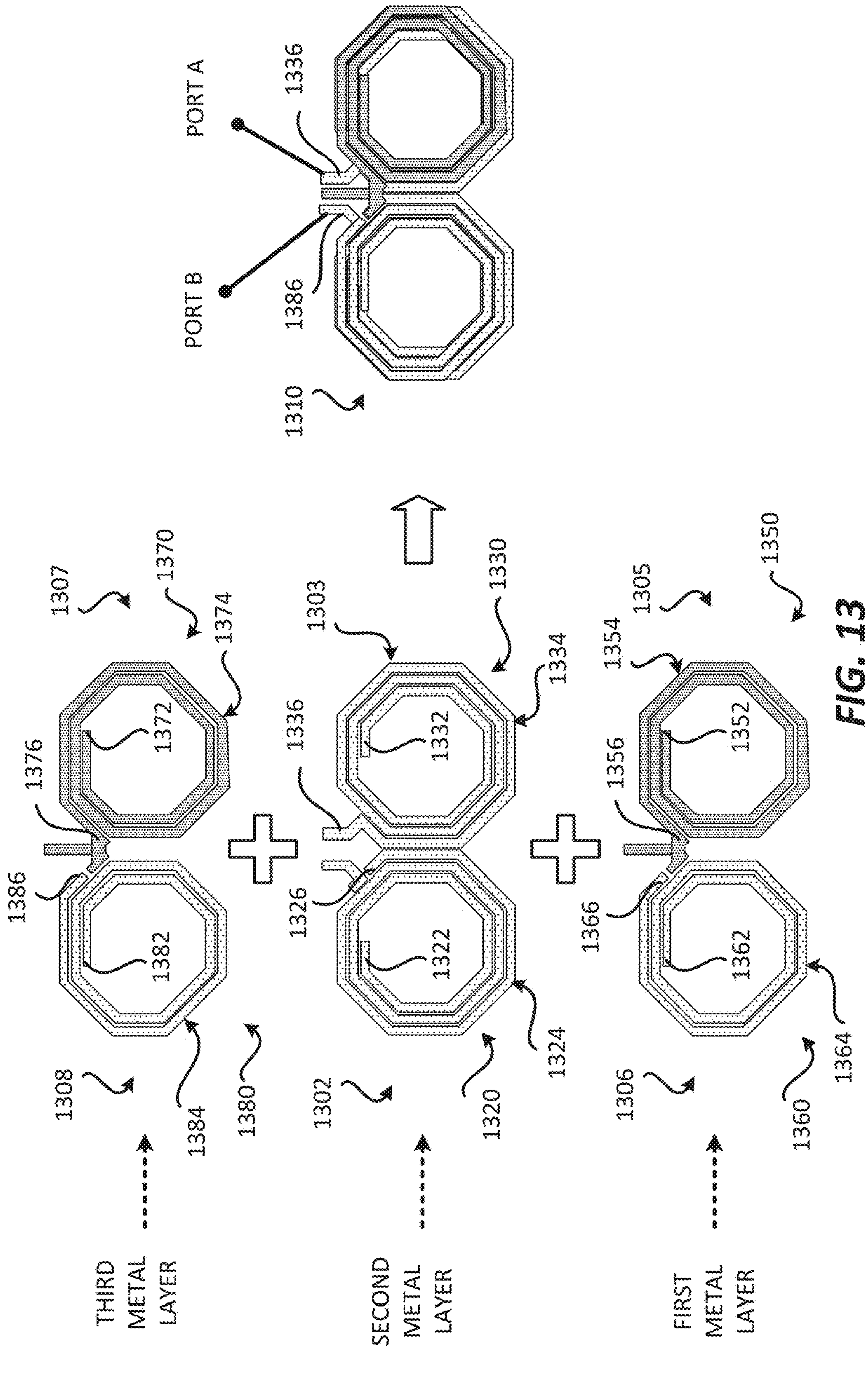
FIG. 13 illustrates an exemplary view of a stacked inductor comprising a figure 8-shaped inductor.

FIG. 13 illustrates an inductor 1302, an inductor 1303, an inductor 1305, an inductor 1306, an inductor 1307, and an inductor 1308. Some of the inductors are located on different metal layers. For example, (i) the inductor 1305 and the inductor 1306 may be located on a first metal layer, (ii) the inductor 1302, the inductor 1303 and the inductor 1309 may be located on a second metal layer, and (iii) the inductor 1307 and the inductor 1308 may be located on a third metal layer. FIG. 13 illustrates an example of at least two figure 8-shaped inductors and/or spirals that are vertically stacked (e.g., stacked figure 8-shaped inductor). The figure 8-shaped inductors may be intertwined over several metal layers. For example, different spirals and/or different inductors from the stacked inductor 1310 may be intertwined.

In some implementations, the inductor 1302, the inductor 1303, the inductor 1305, the inductor 1306, the inductor 1307, the inductor 1308, and/or the inductor 1309 may be coupled together in shunt and/or series. In some implementations, the inductor 1302, the inductor 1303, the inductor 1305, the inductor 1306, the inductor 1307, and/or the inductor 1308 may be configured to operate as one inductor. For example, the inductor 1302, the inductor 1303, the inductor 1305, the inductor 1306, the inductor 1307, and/or the inductor 1308 may be configured as a stacked inductor 1310.

The inductor 1302 includes a spiral 1320, an origin 1322, a tail 1324 and a tail terminal 1326. The spiral 1320 may include the origin 1322, the tail 1324 and the tail terminal 1326. In some implementations, the spiral 1320 may have a second rotational direction (e.g., counter clockwise rotation). The inductor 1303 includes a spiral 1330, an origin 1332, a tail 1334 and a tail terminal 1336. The spiral 1330 may include the origin 1332, the tail 1334 and the tail terminal 1336. In some implementations, the spiral 1330 may have a first rotational direction (e.g., clockwise rotation). The inductor 1305 includes a spiral 1350, an origin 1352, a tail 1354 and a tail terminal 1356. The spiral 1350 may include the origin 1352, the tail 1354 and the tail terminal 1356. In some implementations, the spiral 1350 may have a second rotational direction (e.g., counter clockwise rotation). The inductor 1306 includes a spiral 1360, an origin 1362, a tail 1364 and a tail terminal 1366. The spiral 1360 may include the origin 1362, the tail 1364 and the tail terminal 1366. In some implementations, the spiral 1360 may have a first rotational direction (e.g., clockwise rotation). The inductor 1307 includes a spiral 1370, an origin 1372, a tail 1374 and a tail terminal 1376. The spiral 1370 may include the origin 1372, the tail 1374 and the tail terminal 1376. In some implementations, the spiral 1370 may have a second rotational direction (e.g., counter clockwise rotation). The inductor 1308 includes a spiral 1380, an origin 1382, a tail 1384 and a tail terminal 1386. The spiral 1380 may include the origin 1382, the tail 1384 and the tail terminal 1386. In some implementations, the spiral 1380 may have a first rotational direction (e.g., clockwise rotation). A rotational direction of a spiral may be defined by the origin of the spiral as being the starting point of the spiral. In some implementations, the spiral 1320, the spiral 1330, the spiral, 1350, the spiral 1360, the spiral 1370 and/or the spiral 1380 have a different rotational direction.

The inductor 1302, the inductor 1303, the inductor 1305, the inductor 1306, the inductor 1307, and/or the inductor 1308 may form a stacked inductor 1310 that includes several spirals, windings and/or turns. The stacked inductor 1310 formed from the inductor 1302, the inductor 1303, the inductor 1305, the inductor 1306, the inductor 1307, the inductor 1308, and/or the inductor 1309 may be located on three or more metal layers. The stacked inductor 1310 may include two figure 8-shaped spirals that are interleaved.

The inductor 1302, the inductor 1306 and/or the inductor 1308 may vertically overlap with each other. The inductor 1303, the inductor 1305, and/or the inductor 1307 may vertically overlap with each other.

It is noted that the first metal layer, the second metal layer and/or the third metal layer may be adjacent to each other. However, in some implementations, there may be one or more metal layers between (i) the first metal layer and the second metal layer, (ii) the first metal layer and the third metal layer, and/or (iii) the second metal layer and the third metal layer. For example, in some implementations, the first metal layer may be an M1 metal layer, the second metal layer may be a M2 metal layer, and the third metal layer may be a M3 metal layer. In another example, in some implementations, the first metal layer may be an M4 metal layer, the second metal layer may be a M3 metal layer and the third metal layer may be a M3 metal layer.

Figure 14:
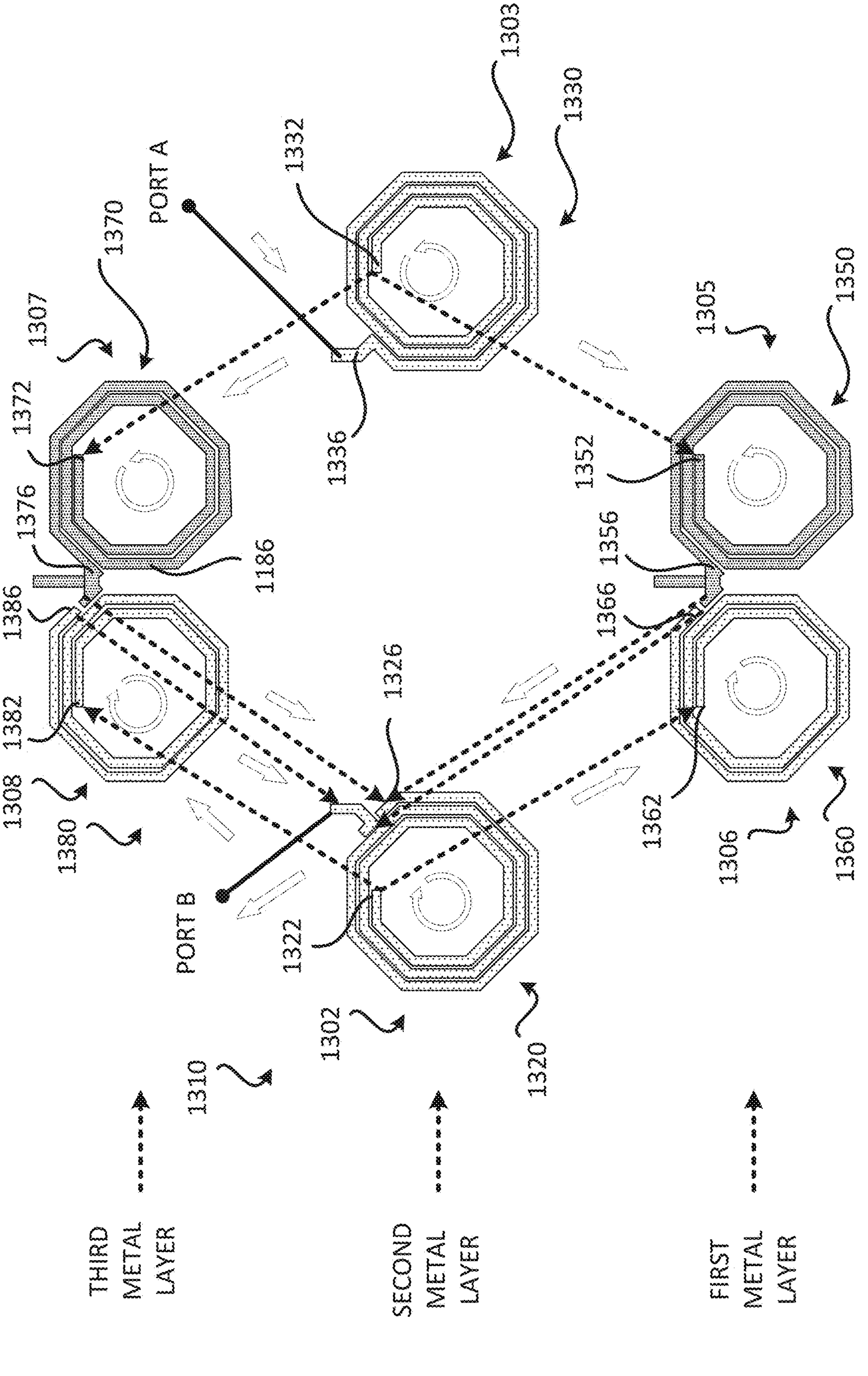
FIG. 14 illustrates an exemplary view of a stacked inductor comprising a figure 8-shaped inductor.

FIG. 14 conceptually illustrates how the inductor 1302, the inductor 1303, the inductor 1305, the inductor 1306, the inductor 1307, the inductor 1308, and/or the inductor 1309 may be coupled together to form the stacked inductor 1310. The stacked inductor 1310 includes a first figure 8-shaped inductor and a second figure 8-shaped inductor that are interleaved. In the example of FIG. 14, an exemplary current may flow between port A and port B. The exemplary current may enter through port A and exit through port B. In another example, the exemplary current may enter through port B and exit through port A. Port A may be represented by the tail terminal 1326 of the inductor 1302. Port B may be coupled to and/or represented by a tail terminal 1366 of the inductor 1306 and/or may be coupled to and/or represented by a tail terminal 1386 of the inductor 1308. At least some of the arrows shown in FIG. 14 may illustrate an example of how a current may flow through the stacked inductor 1310.

FIG. 14 illustrates that a current may travel through (i) the inductor 1303, (ii) the inductor 1305 and the inductor 1307 (in parallel), (iii) the inductor 1302, (iv) the inductor 1306 and the inductor 1308 (in parallel), and (v) the inductor 1309. Thus, part of the current travels through the inductor 1305 and part of the current travels through the inductor 1307. Similarly, part of the current travels through the inductor 1306 and part of the current travels through the inductor 1308.

As an example, a current may travel through (i) a first spiral (e.g., 1330) of the inductor 1303, (ii) a second spiral (e.g., 1350) of the inductor 1305 and a third spiral (e.g., 1370) of the inductor 1307, (iii) a fourth spiral (e.g., 1320) of the inductor 1302, (iv) a fifth spiral (e.g., 1360) of the inductor 1306 and a sixth spiral (e.g., 1380) of the inductor 1306 and (v) the inductor 1309. A current that flows and/or travels through a second spiral (e.g., 1350) of the inductor 1305 may flow in parallel with a current that flows and/or travels through a third spiral (e.g., 1370) of the inductor 1307. A current that flows and/or travels through a fifth spiral (e.g., 1360) of the inductor 1306 may flow in parallel with a current that flows and/or travels through a sixth spiral (e.g., 1380) of the inductor 1308.

In some implementations, a current (e.g., electrical current) may travel through the stacked inductor 1310 through an electrical path that includes the tail terminal 1336, the tail 1334, the origin 1332, the origin 1352, the tail 1354, the tail terminal 1356, the tail terminal 1326, the tail 1324, the origin 1322, the origin 1362, the tail 1364, the tail terminal 1366 and port B (which is coupled to the tail terminal 1386).

In some implementations, a current (e.g., electrical current) may travel through the stacked inductor 1310 through an electrical path that includes the tail terminal 1336, the tail 1334, the origin 1332, the origin 1372, the tail 1374, the tail terminal 1376, the tail terminal 1326, the tail 1324, the origin 1322, the origin 1382, the tail 1384, the tail terminal 1386 and port B (which is coupled to the tail terminal 1386).

FIG. 14 illustrates various crossing between spirals and/or inductors in the stacked inductors. One or more crossings between spirals and/or inductors may be facilitated by one or more interconnects (e.g., vias, pads, traces). The origin 1332 may be coupled to the origin 1352 through one or more interconnects (e.g., vias, pads, traces). The origin 1332 may be coupled to the origin 1372 through one or more interconnects (e.g., vias, pads, traces). The tail terminal 1356 may be coupled to the tail terminal 1326 through one or more interconnects (e.g., vias, pads, traces). The tail terminal 1376 may be coupled to the tail terminal 1326 through one or more interconnects (e.g., vias, pads, traces). The origin 1322 may be coupled to the origin 1362 through one or more interconnects (e.g., vias, pads, traces). The origin 1322 may be coupled to the origin 1382 through one or more interconnects (e.g., vias, pads, traces). The tail terminal 1366 may be coupled to the port B through one or more interconnects (e.g., vias, pads, traces). The tail terminal 1386 may be coupled to the port B through one or more interconnects (e.g., vias, pads, traces).

The design of the stacked inductor 1310 may provide high inductance values while occupying a much smaller footprint and/or real estate in the package. This allows the package and/or the integrated device to have a smaller lateral area through the sharing of lateral space and/or vertical stacking with one another, without sacrificing and/or diminishing the performance of the package and/or the integrated device. Thus, the stacked inductor 1310 that is located on several metal layers may provide an inductance that is similar to an inductance of a comparable inductor that is larger in lateral size than the stacked inductor 1310.

The inductors described in the disclosure may be defined and/or formed by one or more interconnects. For example, the spiral, the origin, the tail and/or the tail terminal of any inductor may be defined and/or formed by one or more interconnects. The one or more interconnects may be located on one or more metal layers. An interconnect such as a via (e.g., via interconnect) may also be located between metal layers. A spiral of an inductor may be referred to as an inductor spiral. An origin of an inductor may be referred to as an inductor origin. The origin of an inductor may be an origin terminal (e.g., inductor origin terminal). A tail of an inductor may be referred to as an inductor tail. A tail terminal of an inductor may be referred to as an inductor tail terminal. In some implementations, the tail terminal of an inductor may be considered part of the tail of the inductor. A coil of an inductor may be similar and/or the same as a spiral of an inductor.

It is noted that any of the inductors described in the disclosure may have different designs, including different spirals, different numbers of turns, different windings, and/or different crossings. The number of turns in the spiral in the inductors shown in the disclosure are exemplary. Different implementations may have inductors with spirals that have different numbers of turns. The designs of the inductors are not limited to what is shown in the figures of the disclosure. Different implementations may have different designs to form symmetrical inductors to achieve a mutual inductance of zero (0) or near zero.

An integrated device (e.g., 103) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes.

FIGS. 9-14 illustrate examples of inductors and/or stacked inductors that may be implemented in different parts of a package. As mentioned above, the inductors of FIGS. 9-14 may be implemented in an integrated device, a substrate and/or a board. For example, the inductors of FIGS. 9-14 may be implemented in various parts of the integrated device of FIG. 7 and/or the various parts of the package of FIG. 8. Any of the inductors described in the disclosure may have different designs, including different spirals, different numbers of turns, different windings, different crossings and/or different underpasses/overpasses. The number of turns in the spiral in the inductors shown in the disclosure are exemplary. Different implementations may have inductors with spirals that have different numbers of turns. The designs of the inductors are not limited to what is shown in the figures of the disclosure. Different implementations may have different designs to form symmetrical inductors to achieve a mutual inductance of zero (0) or near zero. The first inductor and the second inductor described in the disclosure may have a mutual inductance (e.g., coefficient of coupling K) in a range of about 0-0.1. The inductors described in the disclosure may formed on two or more metal layers. In some implementations, a first inductor may be coupled to a second inductor in shunt and/or series. In some implementations, any of the first inductor and any of the second inductor from the disclosure may be configured as a transformer.

It is noted that any of the inductors may be a first inductor, any of the inductors may be a second inductor, any of the inductors may be a third inductor, any of the inductors may be a fourth inductor, any of the inductors may be a fifth inductor, and/or any of the inductors may be a sixth inductor. In some implementations, an inductor may be an inductor portion that is part of an inductor defined by one or more inductors and/or inductor portions. Similarly, it is noted that any of the spirals may be a first spiral, any of the spirals may be a second spiral, any of the spirals may be a third spiral, any of the spirals may be a fourth spiral, any of the spirals may be a fifth spiral, and/or any of the spirals may be a sixth spiral. A figure 8-shaped inductor may be defined by two or more spirals. The two or more spirals of a figure 8-shaped inductor, may be located on the same metal layer or on two or more metal layers. Two spirals of an inductor may be directly or indirectly coupled (e.g., mechanically coupled) to each other.

Exemplary Sequence for Fabricating an Integrated Device

Figure 15A:
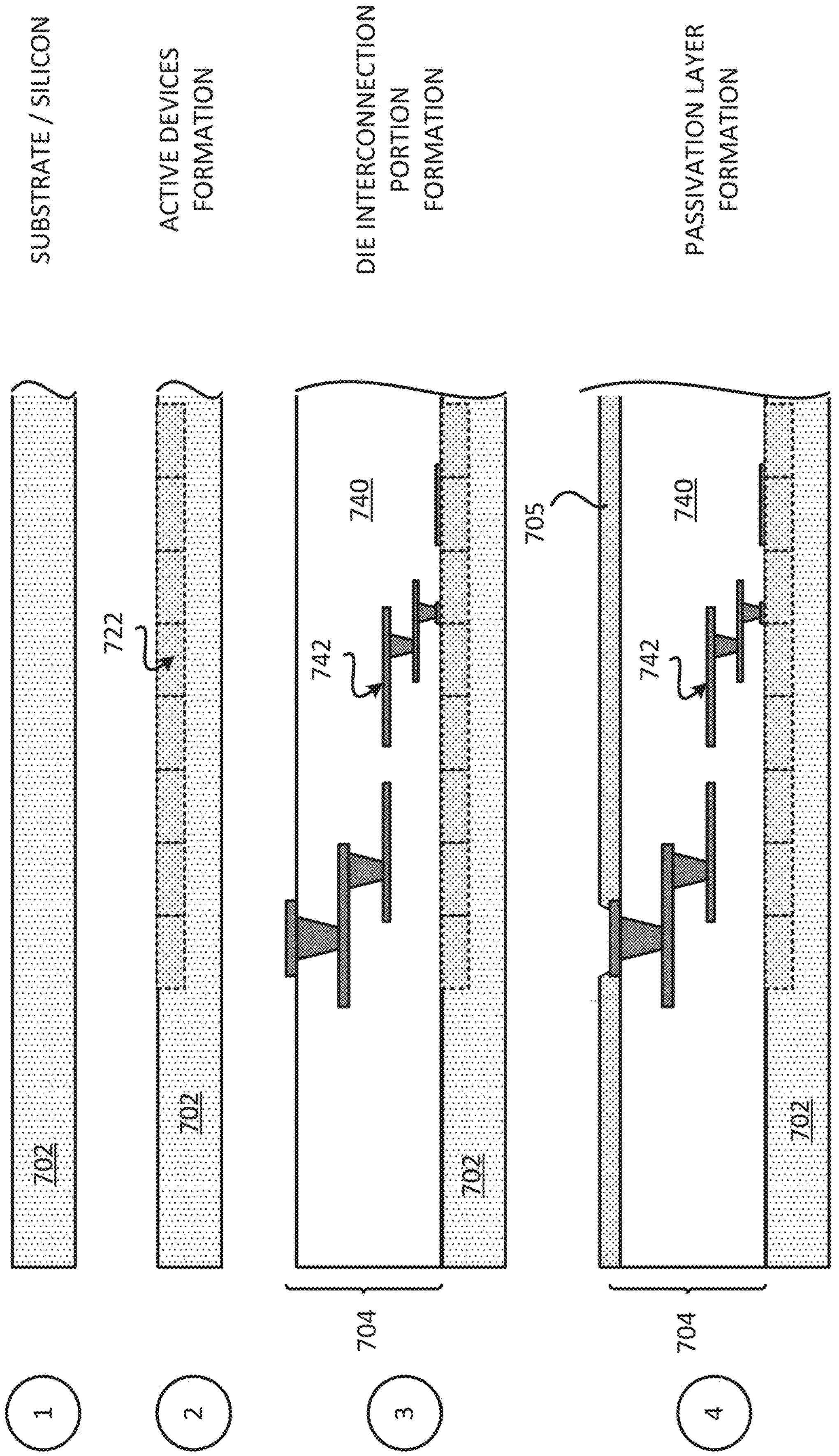
FIGS. 15A-15C illustrate an exemplary sequence for fabricating an integrated device.
Figure 15B:
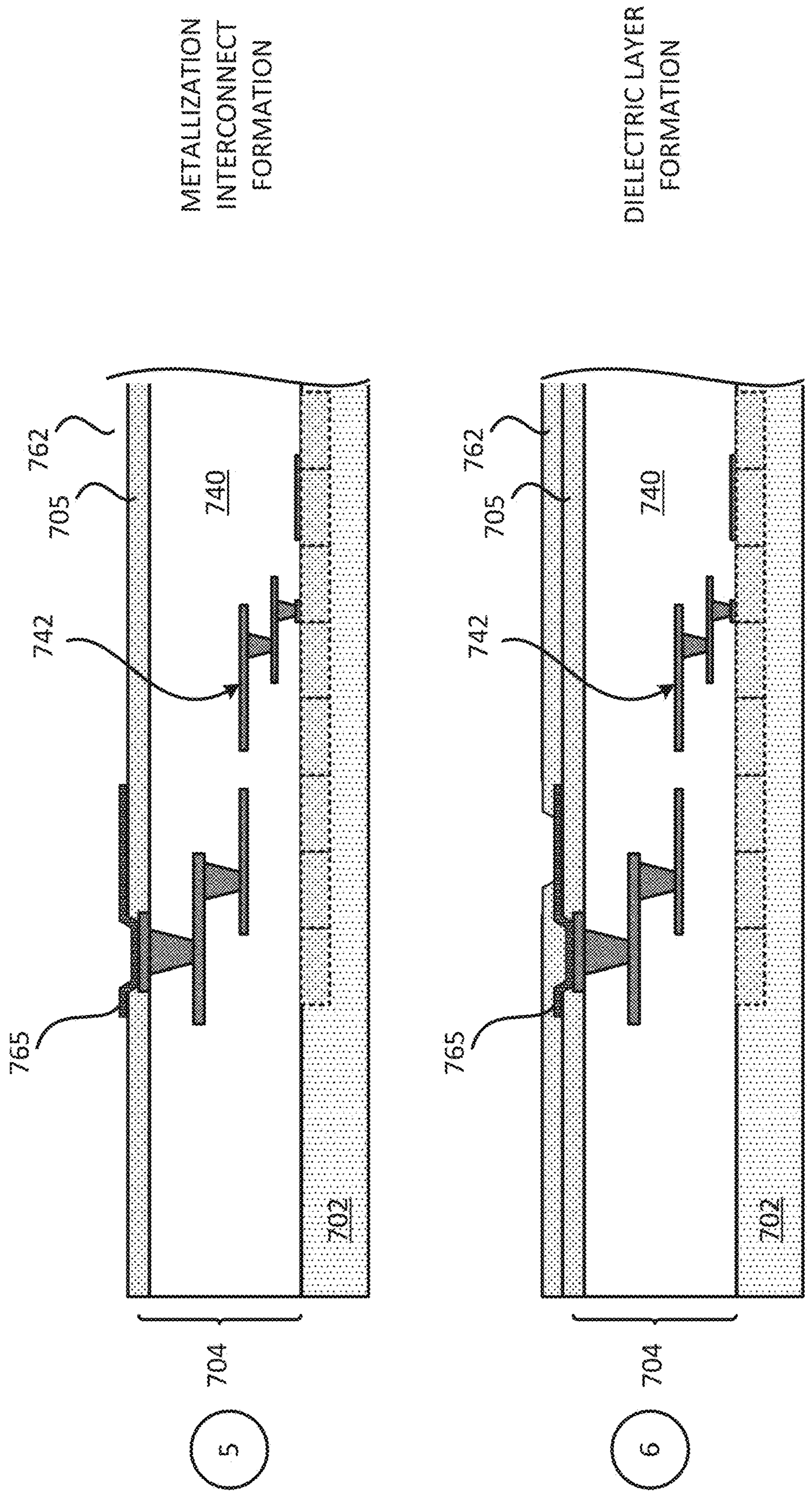
Figure 15C:
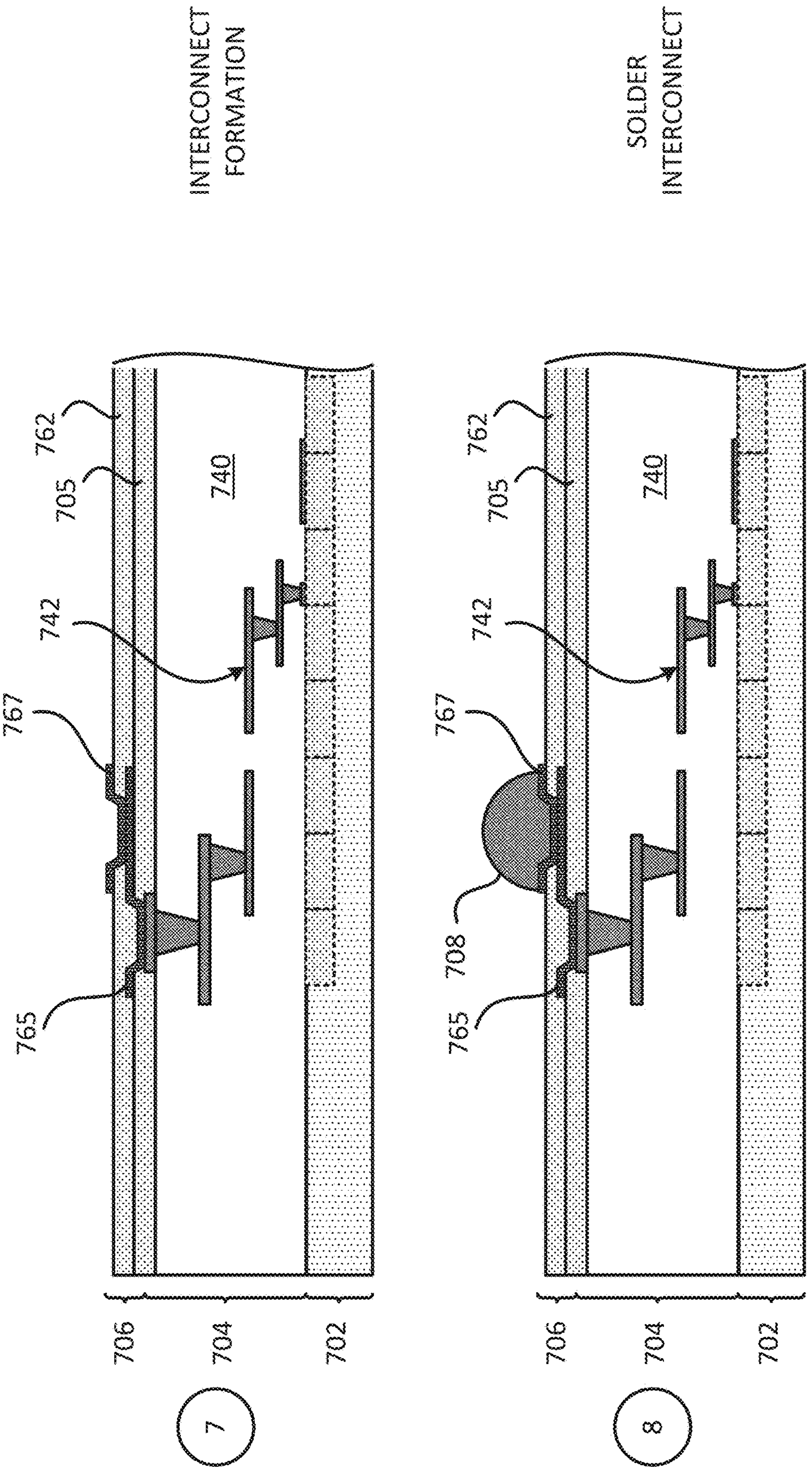

FIGS. 15A-15C illustrate an exemplary sequence for providing or fabricating an integrated device. In some implementations, the sequence of FIGS. 15A-15C may be used to provide or fabricate the integrated device 700 of FIG. 7, or any of the integrated devices described in the disclosure.

It should be noted that the sequence of FIGS. 15A-15C may combine one or more stages in order to simplify and/or clarify the sequence for providing or fabricating the integrated device. In some implementations, the order of the processes may be changed or modified. In some implementations, one or more of processes may be replaced or substituted without departing from the scope of the disclosure. The sequence of FIGS. 15A-15C may be used to fabricate one integrated device or several integrated devices at a time (as part of a wafer).

Stage 1, as shown in FIG. 15A illustrates a state after a die substrate 702 is provided. The die substrate 702 may include a wafer. The die substrate 702 may include silicon.

Stage 2 illustrates a state after a plurality of active devices are formed in and over the die substrate 702. The active devices may be part of the device level 722 of an integrated device. The plurality of active devices may include a plurality of cells (e.g., logic cells) and/or a plurality of transistors (not shown) that may be formed in and/or over the die substrate 702. The plurality of cells (e.g., logic cells) and/or a plurality of transistors (not shown) may be part of the device level 722 of the integrated device 700. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 702.

Stage 3 illustrates a state after an interconnection portion 704 is formed. The interconnection portion 704 is located over and coupled to the die substrate 702. The interconnection portion 704 may be coupled to the plurality of cells and/or transistors located in and/or over the die substrate 702. The interconnection portion 704 (e.g., die interconnection portion) may include at least one dielectric layer 740 (e.g., die dielectric layer) and a plurality of die interconnects 742. The plurality of die interconnects 742 may be coupled to the plurality of cells and/or transistors. In some implementations, a back end of line (BEOL) process may be used to fabricate the interconnection portion 704.

Stage 4 illustrates a state after a passivation layer 705 is formed. The passivation layer 705 may be a dielectric layer. The passivation layer 705 may be considered part of the interconnection portion 704. The passivation layer 705 may be located over the at least one dielectric layer 740. A deposition and/or lamination process may be used to form the passivation layer 705.

Stage 5, as shown in FIG. 15B, illustrates a state after a plurality of metallization interconnects 765 are formed. The plurality of metallization interconnects 765 are coupled to a die interconnect from the plurality of die interconnects 742. A plating process may be used to form the plurality of metallization interconnects 765.

Stage 6 illustrates a state after a dielectric layer 762 is formed. The dielectric layer 762 may be located over the passivation layer 705 and the metallization interconnect 765. A deposition and/or lamination process may be used to form the dielectric layer 762.

Stage 7, as shown in FIG. 15C, illustrates a state after a plurality of under bump metallization interconnects 767 are formed. The plurality of under bump metallization interconnects 767 are coupled to metallization interconnect 765. A plating process may be used to form the plurality of under bump metallization interconnects 767. In some implementations, the plurality of metallization interconnects 765, the dielectric layer 762 and the plurality of under bump metallization interconnects 767 may be part of a metallization portion 706 of an integrated device.

Stage 8 illustrates a state after a plurality of solder interconnects 708 are coupled to the plurality of under bump metallization interconnects 767. A solder reflow process may be used to form the plurality of solder interconnects 708. The metallization portion 706 may be optional. In such instances, the plurality of solder interconnects 708 may be coupled to the plurality of die interconnects 742 (e.g., directly coupled to pad interconnects from the plurality of die interconnects 742).

Exemplary Flow Diagram of a Method for Fabricating an Integrated Device

Figure 16:
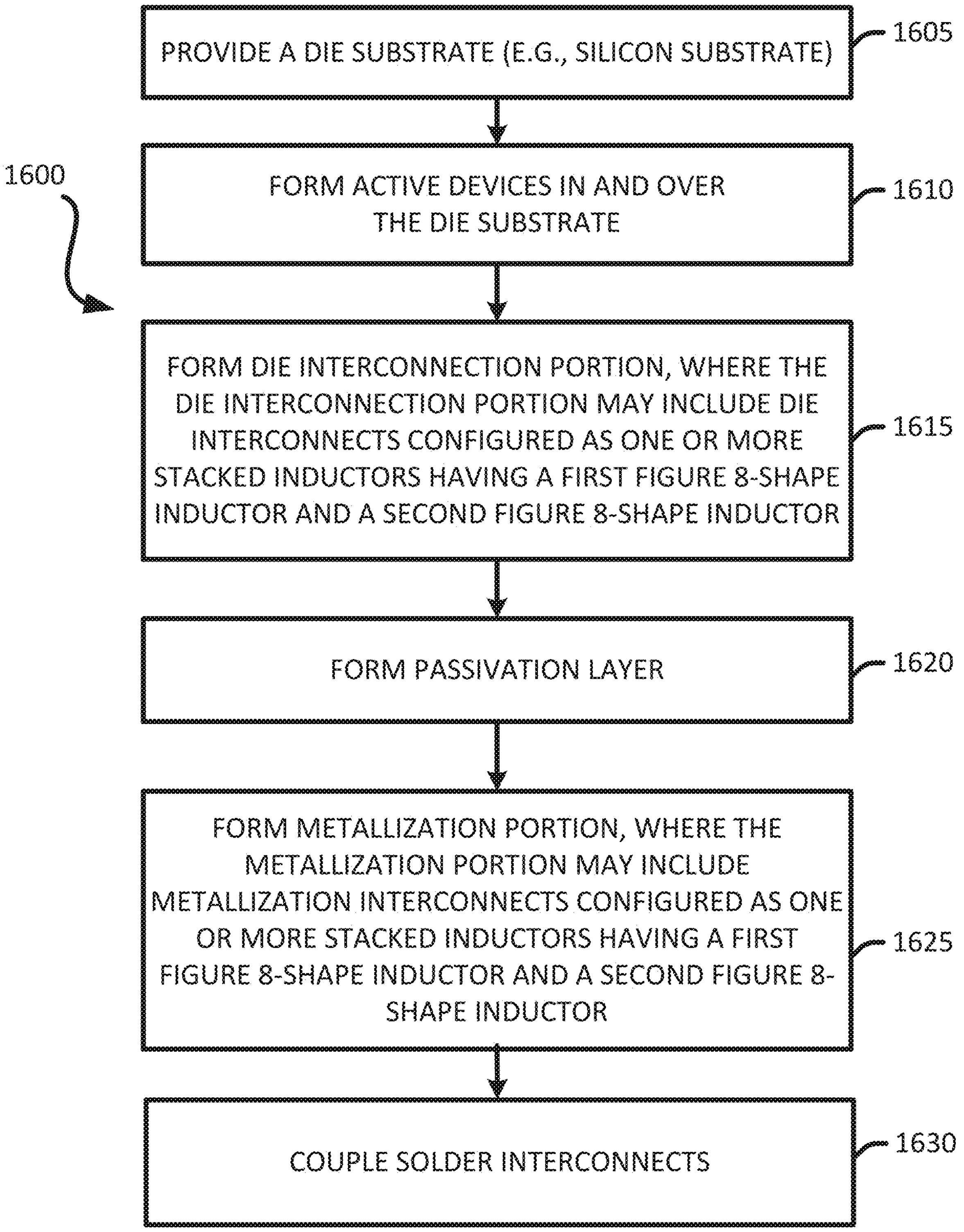
FIG. 16 illustrates an exemplary flow diagram of a method for fabricating an integrated device.

In some implementations, fabricating an integrated device includes several processes. FIG. 16 illustrates an exemplary flow diagram of a method 1600 for providing or fabricating an integrated device. In some implementations, the method 1600 of FIG. 16 may be used to provide or fabricate any of the integrated devices of the disclosure. For example, the method 1600 of FIG. 16 may be used to fabricate the integrated device 700.

It should be noted that the method 1600 of FIG. 16 may combine one or more processes in order to simplify and/or clarify the method for providing or fabricating a package. In some implementations, the order of the processes may be changed or modified. In some implementations, one or more of processes may be replaced or substituted without departing from the scope of the disclosure. The method 1600 of FIG. 16 may be used to fabricate one integrated device or several integrated devices at a time (as part of a wafer).

The method provides (at 1605) a die substrate. Stage 1 of FIG. 15A, illustrates and describes an example of a die substrate 702 that is provided. The die substrate 702 may include a wafer. The die substrate 702 may include silicon.

The method forms (at 1610) form active devices in the and over the die substrate. Stage 2 of FIG. 15A, illustrates and describes an example of a plurality of active devices that are formed in and over the die substrate 702. The active devices may be part of the device level 722 of an integrated device. The plurality of active devices may include a plurality of cells (e.g., logic cells) and/or a plurality of transistors (not shown) that may be formed in and/or over the die substrate 702. The plurality of cells (e.g., logic cells) and/or a plurality of transistors (not shown) may be part of the device level 722 of the integrated device 700. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 702.

The method forms (at 1615) a die interconnection portion that is coupled to the die substrate. Forming the die interconnection portion includes forming at least one dielectric layer and a plurality of die interconnects. Stage 3 of FIG. 15A, illustrates and describes an example of an interconnection portion 704 is formed. The interconnection portion 704 is located over and coupled to the die substrate 702. The interconnection portion 704 may be coupled to the plurality of cells and/or transistors located in and/or over the die substrate 702. The interconnection portion 704 (e.g., die interconnection portion) may include at least one dielectric layer 740 (e.g., die dielectric layer) and a plurality of die interconnects 742. The plurality of die interconnects 742 may be coupled to the plurality of cells and/or transistors. In some implementations, a back end of line (BEOL) process may be used to fabricate the interconnection portion 704.

The method forms (at 1620) a passivation layer. Stage 4 of FIG. 15A, illustrates and describes an example of a passivation layer 705 that is formed. The passivation layer 705 may be a dielectric layer. The passivation layer 705 may be considered part of the interconnection portion 704. The passivation layer 705 may be located over the at least one dielectric layer 740. A deposition and/or lamination process may be used to form the passivation layer 705.

The method forms (at 1625) a metallization portion that is coupled to the die interconnection portion. Forming the metallization portion may include forming a plurality of metallization interconnects, at least one dielectric layer and/or a plurality of under bump metallization interconnects. Stage 5 of FIG. 15B, illustrates and describes an example of a plurality of metallization interconnects 765 that are formed. The plurality of metallization interconnects 765 are coupled to a die interconnect from the plurality of die interconnects 742. A plating process may be used to form the plurality of metallization interconnects 765. Stage 6 of FIG. 15B, illustrates and describes an example of a dielectric layer 762 that is formed. The dielectric layer 762 may be located over the passivation layer 705 and the metallization interconnect 765. A deposition and/or lamination process may be used to form the dielectric layer 762. Stage 7 of FIG. 15C, illustrates and describes an example of a plurality of under bump metallization interconnects 767 that are formed. The plurality of under bump metallization interconnects 767 are coupled to metallization interconnect 765. A plating process may be used to form the plurality of under bump metallization interconnects 767. In some implementations, the plurality of metallization interconnects 765, the dielectric layer 762 and the plurality of under bump metallization interconnects 767 may be part of a metallization portion 706 of an integrated device.

The method couples (at 1630) a plurality of solder interconnects to a metallization portion. Stage 8 of FIG. 15C, illustrates and describes an example of a plurality of solder interconnects 708 that are coupled to the plurality of under bump metallization interconnects 767. A solder reflow process may be used to form the plurality of solder interconnects 708. The metallization portion 706 may be optional. In such instances, the plurality of solder interconnects 708 may be coupled to the plurality of die interconnects 742 (e.g., directly coupled to pad interconnects from the plurality of die interconnects 742).

Exemplary Sequence for Fabricating a Package Comprising an Integrated Device and a Metallization Portion FIGS. 17A-17D illustrate an exemplary sequence for providing or fabricating a package that includes an integrated device and a metallization portion. In some implementations, the sequence of FIGS. 17A-17D may be used to provide or fabricate the package 800 of FIG. 8, or any of the packages described in the disclosure.

It should be noted that the sequence of FIGS. 17A-17D may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 17A-17D may be used to fabricate one package or several packages at a time (as part of a wafer).

Figure 17A:
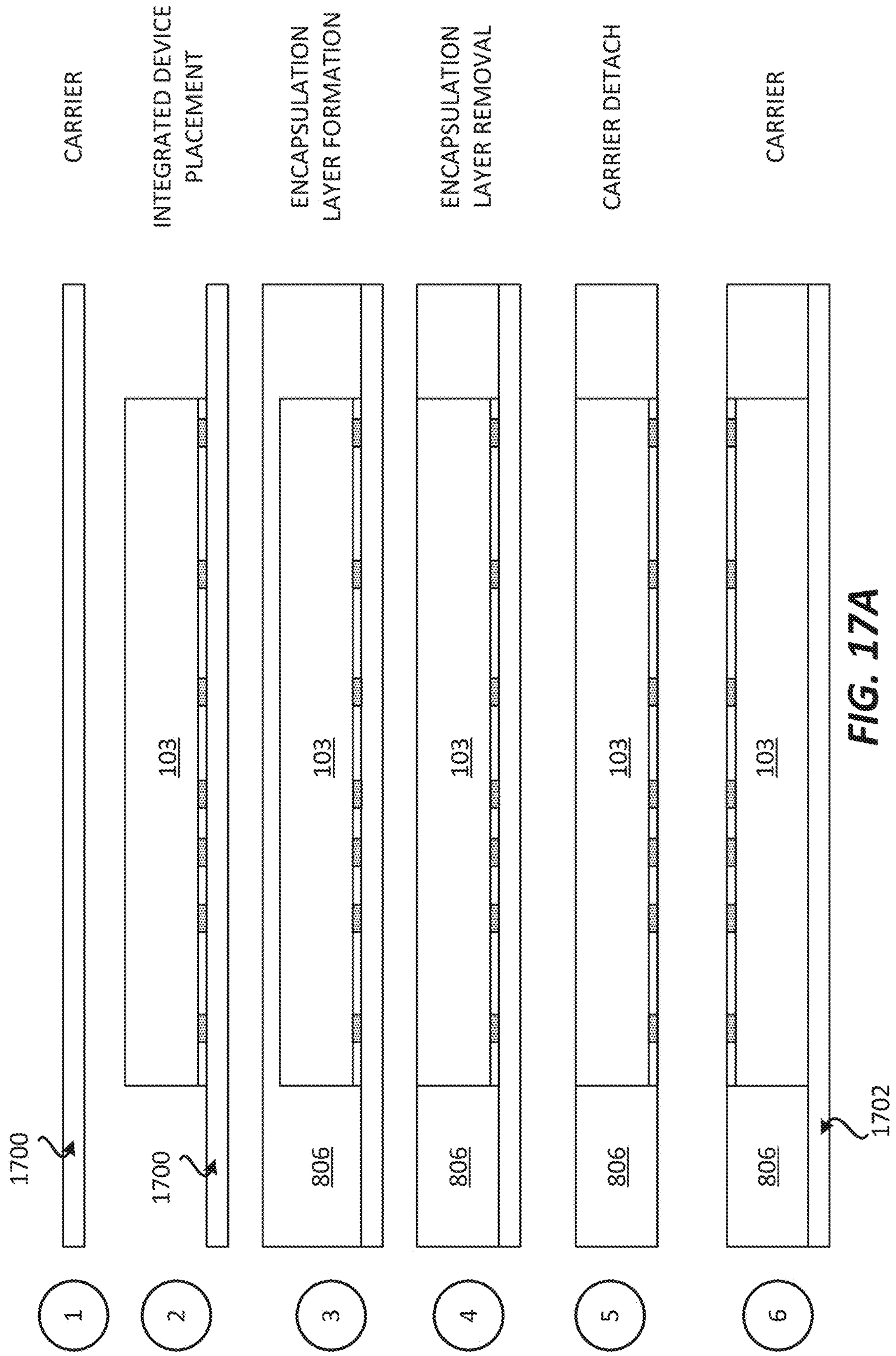
FIGS. 17A-17D illustrate an exemplary sequence for fabricating a package.

Stage 1, as shown in FIG. 17A illustrates a state after a carrier 1700. An adhesive coat/layer may be provided over a surface of the carrier 1700.

Stage 2 illustrates a state after an integrated device 103 is placed on the carrier 1700. A pick and place process may be used to place the integrated device. The front side of the integrated device 103 may be placed on the carrier 1700. In some implementations, more than one integrated device may be placed on the carrier 1700. In some implementations, the integrated device 103 may include one or more inductors as described in the disclosure.

Stage 3 illustrates a state after an encapsulation layer 106 is formed over the carrier 1700 and the integrated device 103. The encapsulation layer 106 may encapsulate the integrated device 103. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process.

Stage 4 illustrates a state after portions of the encapsulation layer 106 may be removed. A grinding process may be used to remove a top portion of the encapsulation layer 106 and/or a back side of the integrated device 103.

Stage 5 illustrates a state after the carrier 1700 is decoupled from the integrated device 103 and the encapsulation layer 106. The carrier 1700 may be detached from the integrated device 103 and the encapsulation layer 106.

Stage 6 illustrates the integrated device 103 and the encapsulation layer 106 are placed on a carrier 1702. The back side of the integrated device 103 may be placed and coupled to the carrier 1702. There may be an adhesive coat on the carrier 1702. A pick and place process may be used to place the integrated device 103 and the encapsulation layer 106 on the carrier 1702.

Figure 17B:
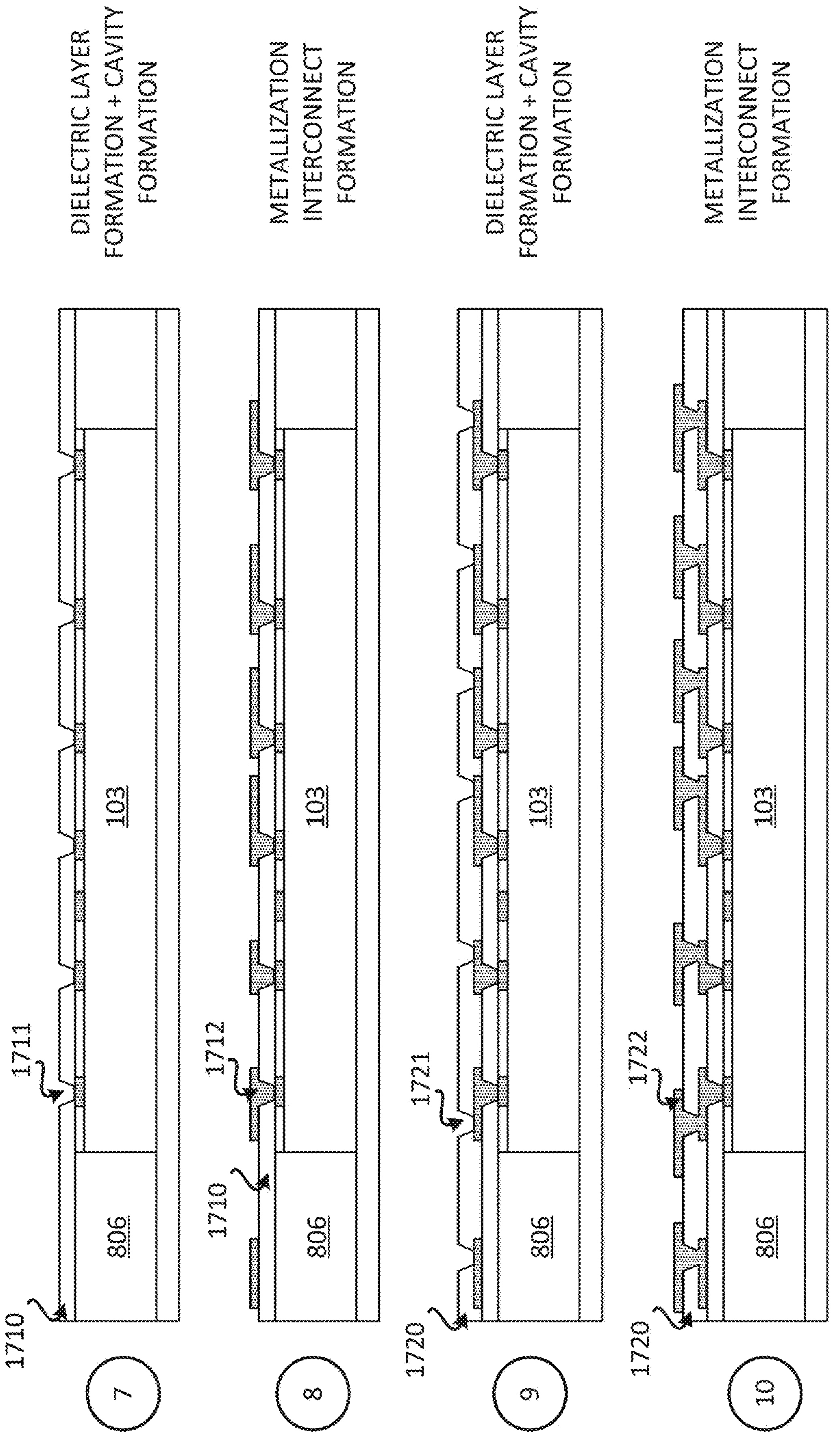

Stage 7, as shown in FIG. 17B, illustrates a state after a dielectric layer 1710 is formed over the integrated device 103 and the encapsulation layer 106. A deposition and/or a lamination process may be used to form the dielectric layer 1710. The dielectric layer 1710 may be formed over a front side of the integrated device 103. Stage 7 also illustrates a state after a plurality of cavities 1711 are formed in the dielectric layer 1710. The plurality of cavities 1711 may be formed using an etching process (e.g., photo etching process). A masking process, an exposure process and/or a development process may be used to form the plurality of cavities 1711. The plurality of cavities 1711 may be formed over the plurality of die interconnects 130 of the integrated device 103, such that the plurality of die interconnects 130 are exposed.

Stage 8 illustrates a state after metallization interconnects are formed in and over surfaces of the dielectric layer 1710 and in the plurality of cavities 1711. A plurality of metallization interconnects 1712 may be formed over (e.g., above) a first surface of the dielectric layer 1710 and the plurality of cavities 1711. A masking process, a plating process, an exposure process, a development process and/or an etching process may be used to form the plurality of metallization interconnects 1712.

Stage 9 illustrates a state after a dielectric layer 1720 is formed over the dielectric layer 1710 and the plurality of metallization interconnects 1712. A deposition and/or a lamination process may be used to form the dielectric layer 1720. Stage 9 also illustrates a state after a plurality of cavities 1721 are formed in the dielectric layer 1720. The plurality of cavities 1721 may be formed using an etching process (e.g., photo etching process). A masking process, an exposure process and/or a development process may be used to form the plurality of cavities 1721. The plurality of cavities 1721 may be formed over the plurality of metallization interconnects 1712, such that portions of the plurality of metallization interconnects 1712 are exposed.

Stage 10 illustrates a state after metallization interconnects are formed in and over surfaces of the dielectric layer 1720 and in the plurality of cavities 1721. A plurality of metallization interconnects 1722 may be formed over (e.g., above) a first surface of the dielectric layer 1720 and the plurality of cavities 1721. A masking process, a plating process, an exposure process, a development process and/or an etching process may be used to form the plurality of metallization interconnects 1722. The plurality of metallization interconnects 1722 may be coupled to the plurality of metallization interconnects 1712.

Figure 17C:
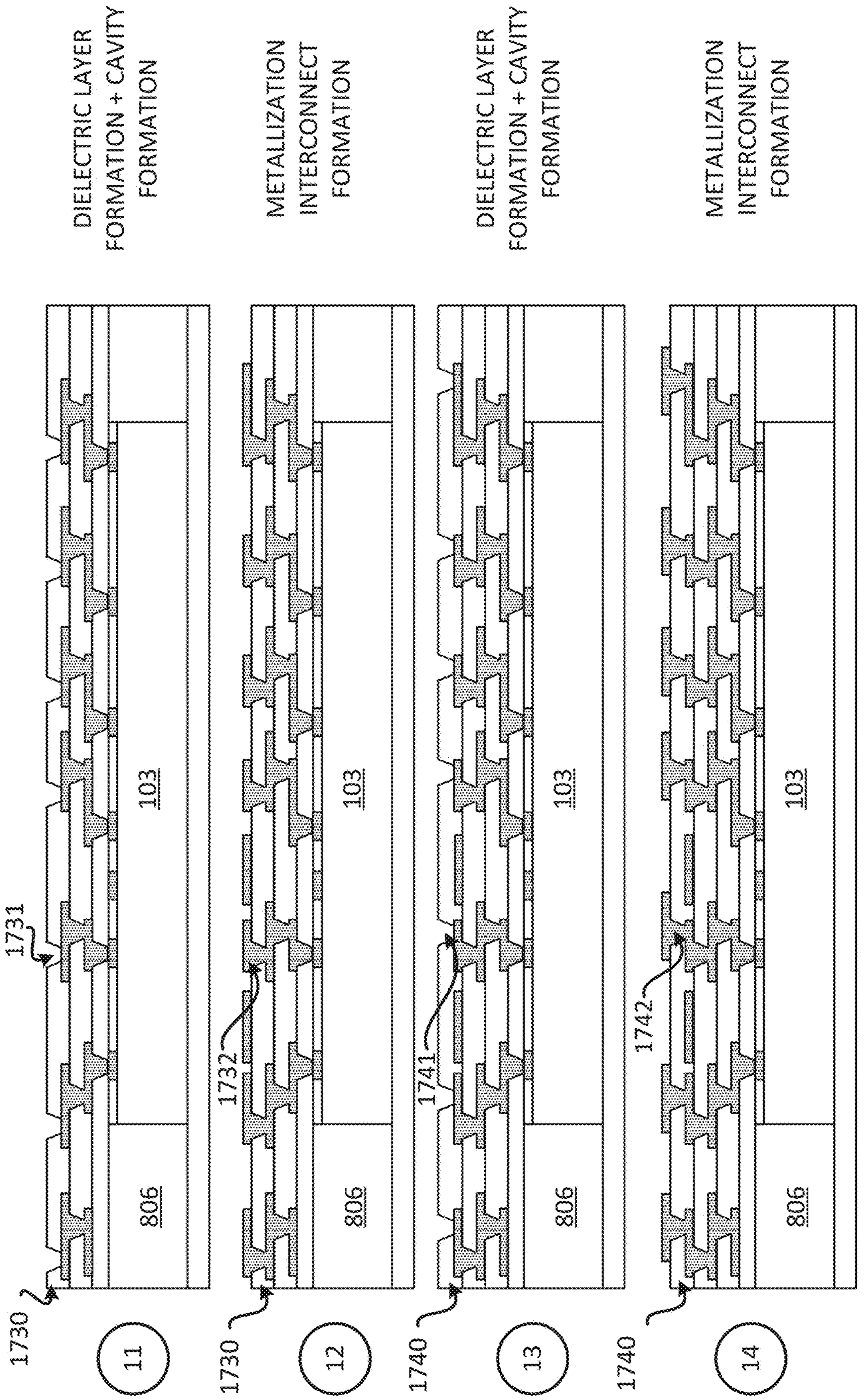

Stage 11, as shown in FIG. 17C, illustrates a state after a dielectric layer 1730 is formed over the dielectric layer 1730 and the plurality of metallization interconnects 1722. A deposition and/or a lamination process may be used to form the dielectric layer 1730. Stage 11 also illustrates a state after a plurality of cavities 1731 are formed in the dielectric layer 1730. The plurality of cavities 1731 may be formed using an etching process (e.g., photo etching process). A masking process, an exposure process and/or a development process may be used to form the plurality of cavities 1731. The plurality of cavities 1731 may be formed over the plurality of metallization interconnects 1722, such that portions of the plurality of metallization interconnects 1722 are exposed.

Stage 12 illustrates a state after metallization interconnects are formed in and over surfaces of the dielectric layer 1730 and in the plurality of cavities 1731. A plurality of metallization interconnects 1732 may be formed over (e.g., above) a first surface of the dielectric layer 1730 and the plurality of cavities 1731. A masking process, a plating process, an exposure process, a development process and/or an etching process may be used to form the plurality of metallization interconnects 1732. The plurality of metallization interconnects 1732 may be coupled to the plurality of metallization interconnects 1722.

Stage 13 illustrates a state after a dielectric layer 1740 is formed over the dielectric layer 1740 and the plurality of metallization interconnects 1732. A deposition and/or a lamination process may be used to form the dielectric layer 1740. Stage 13 also illustrates a state after a plurality of cavities 1741 are formed in the dielectric layer 1740. The plurality of cavities 1741 may be formed using an etching process (e.g., photo etching process). A masking process, an exposure process and/or a development process may be used to form the plurality of cavities 1741. The plurality of cavities 1741 may be formed over the plurality of metallization interconnects 1732, such that portions of the plurality of metallization interconnects 1732 are exposed.

Stage 14 illustrates a state after metallization interconnects are formed in and over surfaces of the dielectric layer 1740 and in the plurality of cavities 1741. A plurality of metallization interconnects 1742 may be formed over (e.g., above) a first surface of the dielectric layer 1740 and the plurality of cavities 1741. A masking process, a plating process, an exposure process, a development process and/or an etching process may be used to form the plurality of metallization interconnects 1742. The plurality of metallization interconnects 1742 may be coupled to the plurality of metallization interconnects 1732.

Stage 15 illustrates a state after the carrier 1702 is decoupled from the integrated device 103 and the encapsulation layer 106. The carrier 1702 may be detached from the integrated device 103 and the encapsulation layer 106. The dielectric layer 820 may represent the dielectric layer 1710, the dielectric layer 1720, the dielectric layer 1730 and/or the dielectric layer 1740. The plurality of metallization interconnects 822 may represent the plurality of metallization interconnects 1712, the plurality of metallization interconnects 1722, the plurality of metallization interconnects 1732 and/or the plurality of metallization interconnects 1742. In some implementations, the metallization portion 802 may include one or more inductors as described in the disclosure.

Stage 16 illustrates a state after a plurality of solder interconnects 110 are coupled to the metallization portion 802. A solder reflow process may be used to couple the plurality of solder interconnects 110 to the plurality of metallization interconnects 822 of the metallization portion 802.

Figure 18:
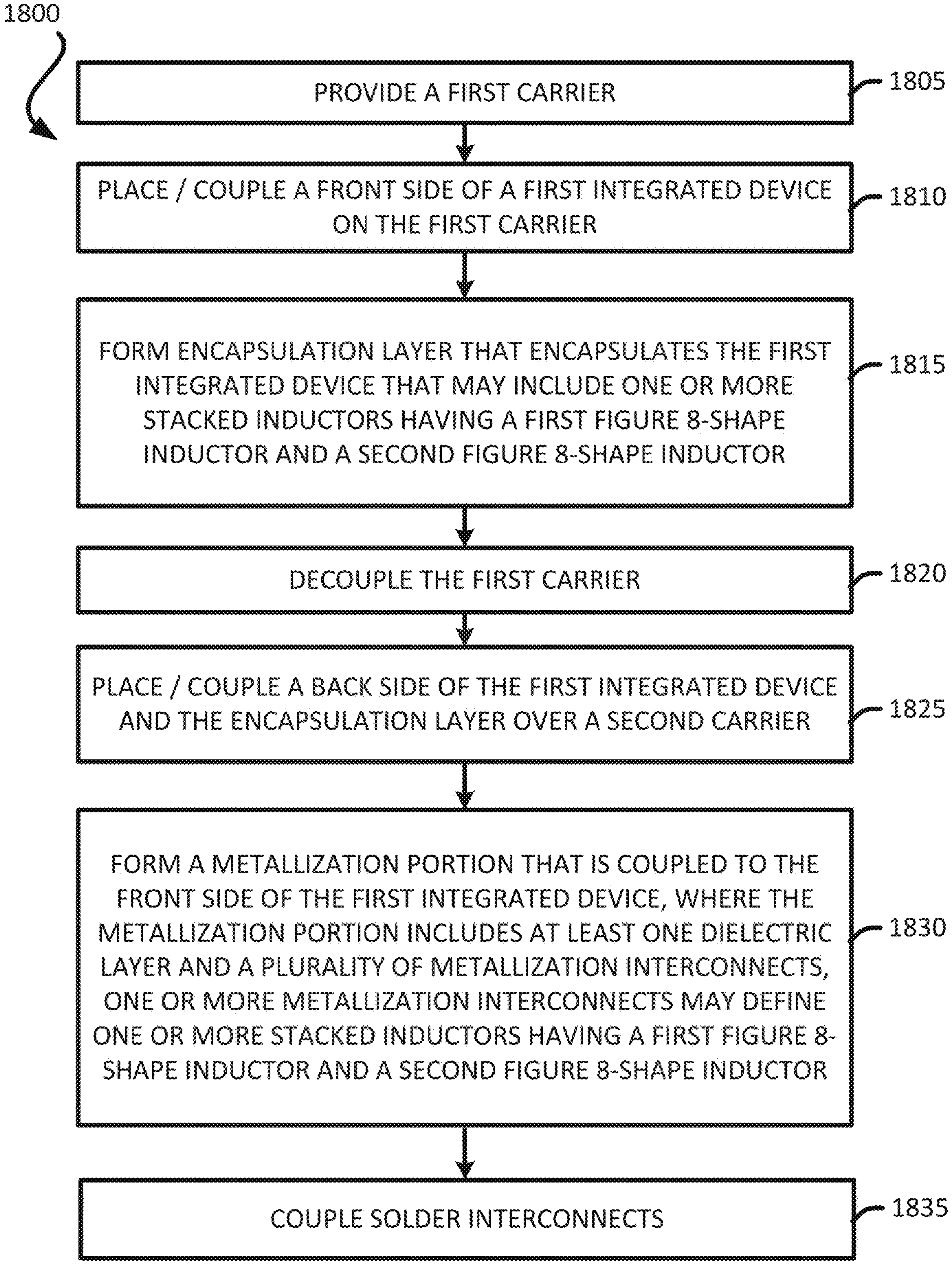
FIG. 18 illustrates an exemplary flow diagram of a method for fabricating a package.

Exemplary Flow Diagram of a Method for Fabricating a Package Comprising an Integrated Device and a Metallization Portion In some implementations, fabricating a package includes several processes. FIG. 18 illustrates an exemplary flow diagram of a method 1800 for providing or fabricating a package. In some implementations, the method 1800 of FIG. 18 may be used to provide or fabricate any of the packages of the disclosure. For example, the method 1800 of FIG. 18 may be used to fabricate the package 800.

It should be noted that the method 1800 of FIG. 18 may combine one or more processes in order to simplify and/or clarify the method for providing or fabricating a package. In some implementations, the order of the processes may be changed or modified. In some implementations, one or more of processes may be replaced or substituted without departing from the scope of the disclosure. The method 1800 of FIG. 18 may be used to fabricate one package or several packages at a time (as part of a wafer).

The method provides (at 1805) a carrier. In some implementations, the carrier may be provided with an adhesive. Stage 1 of FIG. 17A, illustrates and describes an example of providing a carrier 1700. An adhesive coat/layer may be located over a surface of the carrier 1700.

The method places (at 1810) a front side of an integrated device over the carrier. In some implementations, the front side of the integrated device is placed over a carrier that includes and adhesive. In some implementations, more than one integrated device may be placed over the carrier. Stage 2 of FIG. 17A, illustrates and describes an example of an integrated device 103 that is placed on the carrier 1700. A pick and place process may be used to place the integrated device. The front side of the integrated device 103 may be placed on the carrier 1700. In some implementations, more than one integrated device may be placed on the carrier 1700. In some implementations, the integrated device 103 may include one or more inductors as described in the disclosure.

The method forms (at 1815) an encapsulation layer that encapsulates the integrated device. The encapsulation layer may be coupled to the integrated device and the carrier. Stage 3 of FIG. 17A, illustrates and describes an example of an encapsulation layer 106 that is formed over the carrier 1700 and the integrated device 103. The encapsulation layer 106 may encapsulate the integrated device 103. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. In some implementations, once the encapsulation layer 106 is provided, portions of the encapsulation layer 106 may be removed. For example, a grinding process may be used to remove a top portion of the encapsulation layer 106 and/or a back side of the integrated device 103. Stage 4 of FIG. 17A illustrates and describes an example of removing a portion of the encapsulation layer 106.

The method decouples (at 1820) the carrier from the encapsulation layer and the integrated device. Stage 5 of FIG. 17A, illustrates and describes an example of the carrier 1700 that is decoupled from the integrated device 103 and the encapsulation layer 106. The carrier 1700 may be detached from the integrated device 103 and the encapsulation layer 106.

The method places (at 1825) a back side of the integrated device and the encapsulation layer over another carrier (e.g., second carrier). The carrier may include an adhesive. Stage 6 of FIG. 17B, illustrates and describes an example of the integrated device 103 and the encapsulation layer 106 that are placed on a carrier 1702. The back side of the integrated device 103 may be placed and coupled to the carrier 1702. There may be an adhesive coat on the carrier 1702. A pick and place process may be used to place the integrated device 103 and the encapsulation layer 106 on the carrier 1702.

Figure 17D:
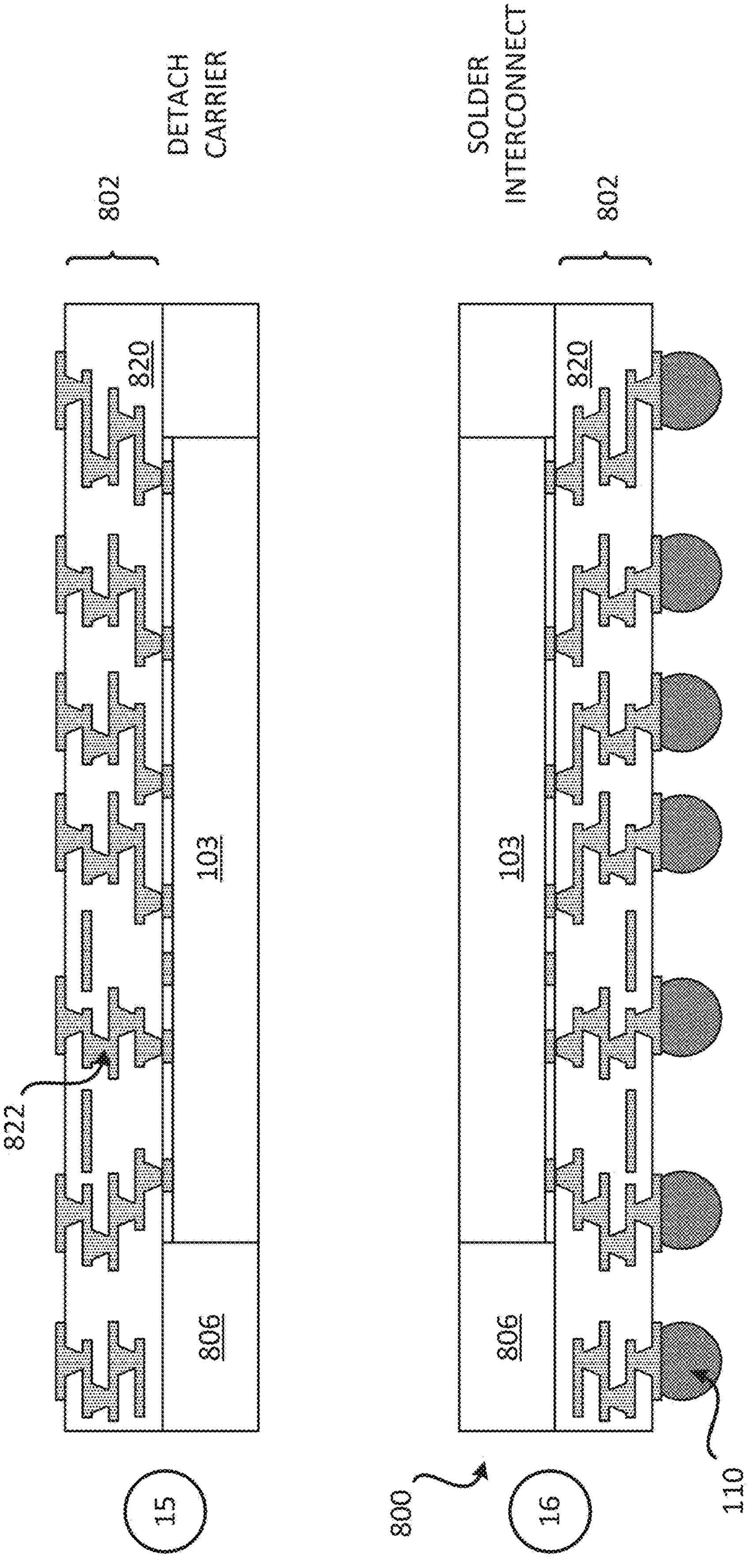

The method forms (at 1830) a metallization portion that is coupled to the front side of the integrated device and the encapsulation layer. The metallization portion may include at least one dielectric layer and a plurality of metallization interconnects. The plurality of metallization interconnects may include a first metallization interconnect on a first metal layer and a second metallization interconnect on a first metal layer, where the second interconnect has a second thickness that is different from a first thickness of the first metallization interconnect. Forming the metallization portion may include forming at least one dielectric layer and forming include a first metallization interconnect on a first metal layer and a second metallization interconnect on a first metal layer. The second interconnect may have a second thickness that is different from a first thickness of the first metallization interconnect. Stage 7 of FIG. 17B through Stage 15 of FIG. 17D illustrate examples of forming a metallization portion that is coupled to at least one integrated device. Different implementations may have different numbers of metal layers. Once the metallization portion is formed (at 1830), the method may decouple the second carrier from the integrated device and the encapsulation layer. In some implementations, the metallization portion 802 may include one or more inductors as described in the disclosure.

The method couples (at 1835) a plurality of solder interconnects to the metallization interconnects of the metallization portion. Stage 16 of FIG. 17D, illustrates and describes an examples of a plurality of solder interconnects 110 that are coupled to the metallization portion 802. A solder reflow process may be used to couple the plurality of solder interconnects 110 to the plurality of metallization interconnects 822 of the metallization portion 802.

Exemplary Electronic Devices

Figure 19:
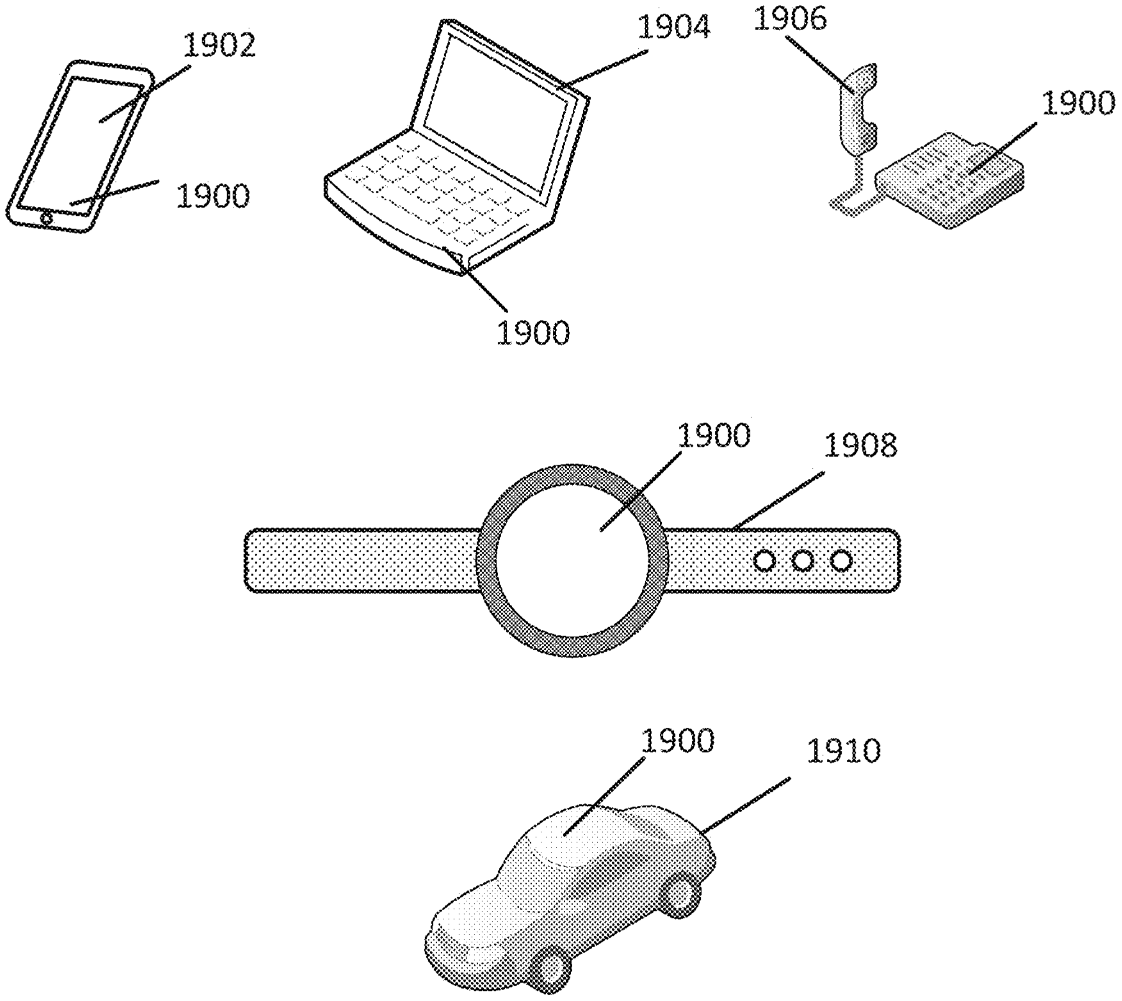
FIG. 19 illustrates various electronic devices that may integrate a die, an electronic circuit, an integrated device, an integrated passive device (IPD), a passive component, a package, and/or a device package described herein.

FIG. 19 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1902, a laptop computer device 1904, a fixed location terminal device 1906, a wearable device 1908, or automotive vehicle 1910 may include a device 1900 as described herein. The device 1900 may be, for example, any of the devices and/or integrated circuit (IC) packages described herein. The devices 1902, 1904, 1906 and 1908 and the vehicle 1910 illustrated in FIG. 19 are merely exemplary. Other electronic devices may also feature the device 1900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-14, 15A-15C, 16, 17A-17D and 18-19 may be rearranged and/or combined into a single component, process, feature or function or embodied in several components, processes, or functions. Additional elements, components, processes, and/or functions may also be added without departing from the disclosure. It should also be noted FIGS. 1-14, 15A-15C, 16, 17A-17D and 18-19 and its corresponding description in the present disclosure is not limited to dies and/or ICs. In some implementations, FIGS. 1-14, 15A-15C, 16, 17A-17D and 18-19 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit.

Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: An integrated device comprising a die substrate; a die interconnection portion coupled to the die substrate; and a stacked inductor that includes a first figure 8-shaped inductor and a second figure 8-shaped inductor.

Aspect 2: The integrated device of aspect 1, wherein the stacked inductor comprises a first spiral comprising a first origin and a first tail; a second spiral comprising a second origin and a second tail; a third spiral comprising a third origin and a third tail; and a fourth spiral comprising a fourth origin and a fourth tail, wherein the first spiral, the second spiral, the third spiral and the fourth spiral form the first figure 8-shaped inductor and the second figure 8-shaped inductor.

Aspect 3: The integrated device of aspect 2, wherein the first spiral and the second spiral form the first figure 8-shaped inductor on a first metal layer, and wherein the third spiral and the fourth spiral form the second figure 8-shaped inductor on a second metal layer.

Aspect 4: The integrated device of aspect 3, wherein the first tail of the first spiral is coupled to the second tail of the second spiral, and wherein the third tail of the third spiral is coupled to the fourth tail of the fourth spiral.

Aspect 5: The integrated device of aspects 2 through 4, further comprising an inductor that laterally surrounds the first spiral and the second spiral, wherein the inductor and the stacked inductor are configured to operate as a transformer.

Aspect 6: The integrated device of aspects 2 through 4, further comprising an inductor located on a second metal layer, wherein the first figure 8-shaped inductor is located on a first metal layer, wherein the second figure 8-shaped inductor on a third metal layer, wherein the inductor is located between the first figure 8-shaped inductor and the second 8-shaped inductor, and wherein the inductor and the stacked inductor are configured to operate as a transformer.

Aspect 7: The integrated device of aspects 2 through 6, wherein the stacked inductor further comprises a fifth spiral comprising a fifth origin and a fifth tail; and a sixth spiral comprising a sixth origin and a sixth tail, wherein the fifth spiral is coupled to the first figure 8-shaped inductor and the second figure 8-shaped inductor, and wherein the sixth spiral is coupled to the first figure 8-shaped inductor and the second figure 8-shaped inductor.

Aspect 8: The integrated device of aspects 2 through 7, wherein the first spiral and the fourth spiral form the first figure 8-shaped inductor on a first metal layer and a third metal layer, wherein the second spiral and the third spiral form the second figure 8-shaped inductor on the first metal layer and the third metal layer, and wherein the first figure 8-shaped inductor is interleaved with the second figure 8-shaped inductor.

Aspect 9: The integrated device of aspect 8, wherein the stacked inductor further comprises a fifth spiral comprising a fifth origin and a fifth tail; and a sixth spiral comprising a sixth origin and a sixth tail, wherein the fifth spiral and the sixth spiral are located on a second metal layer, wherein the fifth spiral is coupled to the first figure 8-shaped inductor and the second figure 8-shaped inductor, and wherein the sixth spiral is coupled to the first figure 8-shaped inductor and the second figure 8-shaped inductor.

Aspect 10: The integrated device of aspects 1 through 9, wherein the stacked inductor comprises a first spiral comprising a first origin and a first tail; a second spiral comprising a second origin and a second tail; a third spiral comprising a third origin and a third tail; a fourth spiral comprising a fourth origin and a fourth tail, a fifth spiral comprising a fifth origin and a fifth tail; and a sixth spiral comprising a sixth origin and a sixth tail, wherein the first spiral, the second spiral, the third spiral, the fourth spiral, the fifth spiral and the sixth spiral form the first figure 8-shaped inductor and the second figure 8-shaped inductor.

Aspect 11: The integrated device of aspect 10, wherein the first spiral and the third spiral are located on a first metal layer, wherein the third spiral and the fourth spiral are located on a third metal layer, and wherein the fifth spiral and the sixth spiral are located on the second metal layer.

Aspect 12: The integrated device of aspects 2 through 10, wherein the first spiral and the fourth spiral are located on a first metal layer, and wherein the second spiral and the third spiral are located on a second metal layer.

Aspect 13: The integrated device of aspects 2 through 12, wherein the second tail of the second spiral winds in a first rotational direction, and wherein the third tail of the third spiral winds in a second rotational direction.

Aspect 14: The integrated device of aspects 2 through 13, wherein the first tail of the first spiral winds in a first rotational direction, and wherein the second tail of the second spiral winds in the first rotational direction.

Aspect 15: The integrated device of aspects 1 through 14, wherein the first figure 8-shaped inductor vertically overlaps with the second figure 8-shaped inductor.

Aspect 16: The integrated device of claim 1, wherein the stacked inductor that includes a first figure 8-shaped inductor and a second figure 8-shaped inductor, is implemented in the die interconnection portion.

Aspect 17: The integrated device of aspect 16, wherein the die interconnection portion includes a plurality of die interconnects, wherein the stacked inductor is formed from die interconnects from the plurality of die interconnects.

Aspect 18: The integrated device of aspects 1 through 17, further comprising a metallization portion coupled to the die interconnection portion, wherein the stacked inductor that includes a first figure 8-shaped inductor and a second figure 8-shaped inductor, is implemented in the die interconnection portion and the metallization portion.

Aspect 19: The integrated device of aspect 18, wherein the die interconnection portion includes a plurality of die interconnects, and wherein the metallization portion includes a plurality of metallization interconnects, wherein the stacked inductor is formed from die interconnects from the plurality of die interconnects and metallization interconnects from the plurality of metallization interconnects.

Aspect 20: The integrated device of aspects 1 through 19, wherein the first figure 8-shaped inductor are coupled in shunt and/or series with the second figure 8-shaped inductor.

Aspect 21: A method for fabricating an integrated device. The method provides a die substrate. The method forms a die interconnection portion coupled to the die substrate, wherein forming the die interconnection portion includes forming a plurality of die interconnects. Some die interconnects from the plurality of die interconnects form a stacked inductor that includes a first figure 8-shaped inductor and a second figure 8-shaped inductor.

Aspect 22: The method of aspect 21, wherein the stacked inductor comprises a first spiral comprising a first origin and a first tail; a second spiral comprising a second origin and a second tail; a third spiral comprising a third origin and a third tail; and a fourth spiral comprising a fourth origin and a fourth tail, wherein the first spiral, the second spiral, the third spiral and the fourth spiral form the first figure 8-shaped inductor and the second figure 8-shaped inductor.

Aspect 23: The method of aspect 22, wherein the first spiral and the second spiral form the first figure 8-shaped inductor on a first metal layer, and wherein the third spiral and the fourth spiral form the second figure 8-shaped inductor on a second metal layer.

Aspect 24: The method of aspect 22, wherein the first spiral and the fourth spiral form the first figure 8-shaped inductor on a first metal layer and a third metal layer, wherein the second spiral and the third spiral form the second figure 8-shaped inductor on the first metal layer and the third metal layer, and wherein the first figure 8-shaped inductor is interleaved with the second figure 8-shaped inductor.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
- a die substrate;
- a die interconnection portion coupled to the die substrate; and
- a stacked inductor that includes a first figure 8-shaped inductor and a second figure 8-shaped inductor,
- wherein the first figure 8-shaped inductor comprises:
  - a first spiral comprising a first origin and a first tail; and
  - a second spiral comprising a second origin and a second tail, wherein the second tail of the second spiral is coupled to the first tail of the first spiral;
- wherein the second figure 8-shaped inductor comprises:
  - a third spiral comprising a third origin and a third tail; and
  - a fourth spiral comprising a fourth origin and a fourth tail, wherein the fourth tail of the fourth spiral is coupled to the third tail of the third spiral,
  - wherein the third spiral vertically overlaps with the first spiral,
  - wherein the fourth spiral vertically overlaps with the second spiral,
  - wherein the first origin of the first spiral and the third origin of the third spiral share a first port, and
  - wherein the second origin of the second spiral and the fourth origin of the fourth spiral share a second port.

2. The integrated device of claim 1, wherein the first port and the second port are configured to allow one or more currents to travel between the first port and the second port through (i) the first spiral and the second spiral and (ii) the third spiral and the fourth spiral, of the stacked inductor.

3. The integrated device of claim 1,
- wherein the first spiral and the second spiral form the first figure 8-shaped inductor on a first metal layer, and
- wherein the third spiral and the fourth spiral form the second figure 8-shaped inductor on a second metal layer.

4. The integrated device of claim 1, wherein the first port and the second port are configured to split a current travelling between the first port and the second port such that (i) a portion of the current travels through the first spiral and the second spiral and (ii) another portion of the current travels through the third spiral and the fourth spiral.

5. The integrated device of claim 1, further comprising an inductor that laterally surrounds the first spiral and the second spiral, wherein the inductor and the stacked inductor are configured to operate as a transformer.

6. The integrated device of claim 1, further comprising an inductor located on a second metal layer,
- wherein the first figure 8-shaped inductor is located on a first metal layer,
- wherein the second figure 8-shaped inductor is located on a third metal layer,
- wherein the inductor is located between the first figure 8-shaped inductor and the second 8-shaped inductor, and
- wherein the inductor and the stacked inductor are configured to operate as a transformer.

7. The integrated device of claim 1, wherein the stacked inductor further comprises:
- a fifth spiral comprising a fifth origin and a fifth tail; and
- a sixth spiral comprising a sixth origin and a sixth tail,
- wherein the fifth spiral is coupled to the first figure 8-shaped inductor and the second figure 8-shaped inductor, and
- wherein the sixth spiral is coupled to the first figure 8-shaped inductor and the second figure 8-shaped inductor.

8. The integrated device of claim 1,
- wherein the first spiral and the fourth spiral form the first figure 8-shaped inductor on a first metal layer and a third metal layer,
- wherein the second spiral and the third spiral form the second figure 8-shaped inductor on the first metal layer and the third metal layer, and
- wherein the first figure 8-shaped inductor is interleaved with the second figure 8-shaped inductor.

9. The integrated device of claim 8, wherein the stacked inductor further comprises:
- a fifth spiral comprising a fifth origin and a fifth tail; and
- a sixth spiral comprising a sixth origin and a sixth tail,
- wherein the fifth spiral and the sixth spiral are located on a second metal layer,
- wherein the fifth spiral is coupled to the first figure 8-shaped inductor and the second figure 8-shaped inductor, and
- wherein the sixth spiral is coupled to the first figure 8-shaped inductor and the second figure 8-shaped inductor.

10. The integrated device of claim 1, wherein the stacked inductor comprises:
- a first spiral comprising a first origin and a first tail;
- a second spiral comprising a second origin and a second tail;
- a third spiral comprising a third origin and a third tail;
- a fourth spiral comprising a fourth origin and a fourth tail,
- a fifth spiral comprising a fifth origin and a fifth tail; and
- a sixth spiral comprising a sixth origin and a sixth tail, wherein the first spiral, the second spiral, the third spiral, the fourth spiral, the fifth spiral and the sixth spiral form the first figure 8-shaped inductor and the second figure 8-shaped inductor.

11. The integrated device of claim 10, wherein the first spiral and the third spiral are located on a first metal layer, wherein the third spiral and the fourth spiral are located on a third metal layer, and wherein the fifth spiral and the sixth spiral are located on the second metal layer.

12. The integrated device of claim 1, wherein the first spiral and the fourth spiral are located on a first metal layer, and wherein the second spiral and the third spiral are located on a second metal layer.

13. The integrated device of claim 1, wherein the second tail of the second spiral winds in a first rotational direction, and wherein the third tail of the third spiral winds in a second rotational direction.

14. The integrated device of claim 1, wherein the first tail of the first spiral winds in a first rotational direction, and wherein the second tail of the second spiral winds in the first rotational direction.

15. The integrated device of claim 1, wherein the first figure 8-shaped inductor vertically overlaps with the second figure 8-shaped inductor, and wherein all portions of the first figure 8-shaped inductor are located on a different metal layer from the second figure 8-shaped inductor.

16. The integrated device of claim 1, wherein the stacked inductor that includes a first figure 8-shaped inductor and a second figure 8-shaped inductor, is implemented in the die interconnection portion.

17. The integrated device of claim 16, wherein the die interconnection portion includes a plurality of die interconnects, wherein the stacked inductor is formed from die interconnects from the plurality of die interconnects.

18. The integrated device of claim 1, further comprising a metallization portion coupled to the die interconnection portion, wherein the stacked inductor that includes a first figure 8-shaped inductor and a second figure 8-shaped inductor, is implemented in the die interconnection portion and the metallization portion.

19. The integrated device of claim 18, wherein the die interconnection portion includes a plurality of die interconnects, and wherein the metallization portion includes a plurality of metallization interconnects, wherein the stacked inductor is formed from die interconnects from the plurality of die interconnects and metallization interconnects from the plurality of metallization interconnects.

20. The integrated device of claim 1, wherein the first figure 8-shaped inductor are coupled in shunt and/or series with the second figure 8-shaped inductor.

21. A method for fabricating an integrated device, comprising:

providing a die substrate;

forming a die interconnection portion coupled to the die substrate, wherein forming the die interconnection portion includes forming a plurality of die interconnects, wherein some die interconnects from the plurality of die interconnects form a stacked inductor that includes a first figure 8-shaped inductor and a second figure 8-shaped inductor, wherein the first figure 8-shaped inductor comprises:

a first spiral comprising a first origin and a first tail; and a second spiral comprising a second origin and a second tail, wherein the second tail of the second spiral is coupled to the first tail of the first spiral;

wherein the second figure 8-shaped inductor comprises:

a third spiral comprising a third origin and a third tail; and a fourth spiral comprising a fourth origin and a fourth tail, wherein the fourth tail of the fourth spiral is coupled to the third tail of the third spiral, wherein the third spiral vertically overlaps with the first spiral, wherein the fourth spiral vertically overlaps with the second spiral, wherein the first origin of the first spiral and the third origin of the third spiral share a first port, and wherein the second origin of the second spiral and the fourth origin of the fourth spiral share a second port.

22. The method of claim 21, wherein the first port and the second port are configured to allow one or more currents to travel between the first port and the second port through (i) the first spiral and the second spiral and (ii) the third spiral and the fourth spiral, of the stacked inductor.

23. The method of claim 21, wherein the first spiral and the second spiral form the first figure 8-shaped inductor on a first metal layer, and wherein the third spiral and the fourth spiral form the second figure 8-shaped inductor on a second metal layer.

24. The method of claim 21, wherein the first spiral and the fourth spiral form the first figure 8-shaped inductor on a first metal layer and a third metal layer, wherein the second spiral and the third spiral form the second figure 8-shaped inductor on the first metal layer and the third metal layer, and wherein the first figure 8-shaped inductor is interleaved with the second figure 8-shaped inductor.

* * * * *